United States Patent
Saito

(10) Patent No.: US 7,228,470 B2
(45) Date of Patent: Jun. 5, 2007

(54) SEMICONDUCTOR TESTING CIRCUIT, SEMICONDUCTOR STORAGE DEVICE, AND SEMICONDUCTOR TESTING METHOD

(75) Inventor: Syuichi Saito, Aichi (JP)

(73) Assignee: Fujitsu Limited, Kawasaki (JP)

( * ) Notice: Subject to any disclaimer, the term of this patent is extended or adjusted under 35 U.S.C. 154(b) by 316 days.

(21) Appl. No.: 10/763,334

(22) Filed: Jan. 26, 2004

(65) Prior Publication Data

US 2004/0177296 A1    Sep. 9, 2004

(30) Foreign Application Priority Data

Feb. 14, 2003    (JP) .............................. 2003-036125

(51) Int. Cl.
  *G11C 29/00*    (2006.01)
  *G06F 11/00*    (2006.01)
  *G01R 31/28*    (2006.01)

(52) U.S. Cl. .................... 714/718; 714/733; 714/706; 365/201

(58) Field of Classification Search .................... None
See application file for complete search history.

(56) References Cited

U.S. PATENT DOCUMENTS 4,253,141 A * 2/1981 Suzuki et al. ................. 700/12
4,873,666 A * 10/1989 Lefebvre et al. ......... 365/189.07
5,007,048 A * 4/1991 Kowalk ...................... 370/235
5,214,611 A * 5/1993 Shigehara et al. .......... 365/236
6,338,154 B2 * 1/2002 Kim .......................... 714/743

FOREIGN PATENT DOCUMENTS

JP    2001222900    8/2001
JP    2002163899    6/2002

* cited by examiner

*Primary Examiner*—Phuong My Chung
(74) *Attorney, Agent, or Firm*—Arent Fox LLP

(57) ABSTRACT

A semiconductor testing circuit being arranged for testing a semiconductor storage device, and having a simple construction and a great number of executable test patterns. Counters designate portions of a write/read address by count values outputted from the counters, respectively, where each of the portions is comprised of one bit or a plurality of successive bits. A switching circuit selectively outputs counter-control signals for individually controlling operations of the counters. Each of the counter-control signals is a common counter-control signal commonly used for the counters or the most significant bit of one of the portions outputted from a first one of the counters other than a second one of the counters for which the counter-control signal is outputted. Thus, it is possible to change assignment of the write/read address to the count values of the counters.

18 Claims, 19 Drawing Sheets

SEMICONDUCTOR TESTING CIRCUIT, SEMICONDUCTOR STORAGE DEVICE, AND SEMICONDUCTOR TESTING METHOD

CROSS-REFERENCE TO RELATED APPLICATIONS

This application is based upon and claims the benefits of priority from the prior Japanese Patent Application No. 2003-036125, filed on Feb. 14, 2003, the entire contents of which are incorporated herein by reference.

BACKGROUND OF THE INVENTION

1) Field of the Invention

The present invention relates to a semiconductor testing circuit and a semiconductor testing method for performing tests of writing or reading operations of a semiconductor storage device, and a semiconductor storage device comprising such a semiconductor testing circuit.

2) Description of the Related Art

The recent movement toward downsizing of electronic devices requires reduction in areas which semiconductor devices occupy in the electronic devices. In addition, in a growing number of cases including the cases of MCPs (Multichip Packages) and SIPs (System in Packages), a plurality of semiconductor chips are arranged in a single package.

For example, devices in which semiconductor storage devices such as DRAMs (Dynamic Random Access Memories) are mounted in MCPs and SIPs are also increasing. In the case of semiconductor storage devices, it is important to detect a defective bit in memory cells during a testing step before shipment. However, in many cases where semiconductor storage devices are mounted in an MCP or SIP, wirings connecting the semiconductor storage devices and other chips are closed within each package. Since, in the above cases, no control terminals of the semiconductor storage devices are provided as external terminals of the packages, it is impossible to perform a test after the semiconductor storage devices and the chips are sealed in the package.

Therefore, it has been proposed to arrange a testing circuit within a chip in which a semiconductor circuit to be tested is arranged, or in another chip which is built in the same package as the chip in which the semiconductor circuit to be tested is arranged, and replace a portion of testing steps with operations of the testing circuit. Such a function being arranged in a package in which a semiconductor circuit to be tested is arranged, and performing a test of the semiconductor circuit is called BIST (Built-In Self Test).

In a typical example of conventional semiconductor storage devices in which a circuit for realizing the BIST function (hereinafter referred to as a BIST circuit) is arranged, a memory cell array divided into a plurality of banks or cell array units and self-testing circuits (corresponding to the BIST circuit) respectively provided for the plurality of banks or cell array units are provided, where the self-testing circuits can be individually controlled. Each of the self-testing circuits comprises: an address generation circuit, a test-pattern-data generation circuit, and a control-signal generation circuit which are associated with the corresponding bank or cell array unit; a BIST control circuit which controls the address generation circuit, the test-pattern-data generation circuit, and the control-signal generation circuit; and comparators which compare data outputted from the corresponding bank or cell array unit during a test with expected values, and the number of which corresponds to the number of output bits of the corresponding bank or cell array unit.

In the above semiconductor storage device, the BIST control circuit operates in response to input of a system clock signal into the BIST control circuit. Under the control of the BIST control circuit, the address generation circuit, the test-pattern-data generation circuit, and the control-signal generation circuit respectively output addresses, test patterns, and control signals for write, readout, and the like, where the addresses, test patterns, and control signals are necessary for the test. Thus, when the memory cell array receives the addresses, test patterns, and control signals, writing and reading operations are performed in the memory cell array. Then, the comparators compare data outputted from the memory cell array by the reading operation with expected values, and determines a pass or fail (see, for example, Japanese Unexamined Patent Publication No. 2002-163899, paragraph Nos. 0009 to 0023 and FIG. 1).

Incidentally, the BIST circuits normally enable execution of more than one type of test patterns which are prepared in advance. For example, each test pattern is designed so that areas in which data are stored in the memory cell array form a geometrical pattern. In addition, combinations of written data and increments in the designated address are changed according to necessity.

FIG. 18 is a diagram illustrating an example of assignment of logical addresses for a memory cell array. In the example of FIG. 18, it is possible to designate a logical address of a memory cell array by a numerical value represented by 22 bits, where the 6 least significant bits, the 14 middle significant bits, and the 2 most significant bits indicate a column address, a row address, and a bank address, respectively. Normally, each BIST circuit comprises a counter circuit for generating write and read addresses as above.

FIG. 19 is a diagram illustrating an exemplary construction of a conventional address counter provided in a BIST circuit. The address counter of FIG. 19 is provided in correspondence with the address assignment of FIG. 18, and has 22 counter cells CNT0 to CNT21 corresponding to the number of bits representing the address. Specifically, the 6 least significant counter cells CNT0 to CNT5, the 14 middle significant counter cells CNT6 to CNT19, and the 2 most significant counter cells CNT20 and CNT21 are assigned to the column address CA0 to CA5, the row address RA0 to RA13, and the bank address BA0 to BA1, respectively. When the values outputted from the address counter are decoded, for example, by an address decoder, a bit line, a word line, and a bank are selected.

In the above address counter, the value of each of the counter cells CNT1 to CNT21 above the least significant counter cell CNT0 is incremented according to the output of a counter cell located immediately below each counter cell. When an increment control signal (e.g., a clock signal CLK) is applied to the least significant counter cell CNT0, a counting operation is started.

In the case where data is written in all memory cells by a self-testing operation of a BIST circuit (hereinafter referred to as a BIST operation), normally the following operations are performed.

At the beginning of the BIST operation, the counter cells are generally in a reset state, i.e., all of the column address, the row address, and the bank address are zero. When the first writing operation is performed with the above values of the column address, the row address, and the bank address, data is written in a memory cell having the address value "0." Next, the count by the address counter is incremented, and the least significant counter bit of the output of the address counter becomes "1." Thus, the second writing operation is performed with the incremented value of the column address, data is written in a memory cell having the address value "1." Thereafter, every time a writing operation is performed, the count by the address counter is incremented, so that data can be written in all of the memory cells.

Further, a self-testing circuit for performing a test of RAMs having different shapes and being arranged within an integrated circuit has been proposed (see, for example, Japanese Unexamined Patent Publication No. 2001-222900, paragraph Nos. 0010 to 0030 and FIG. 1). The self-testing circuit comprises an X-address register, a Y-address register, and a chip-enable-control circuit. The X-address register and the Y-address register are each constituted by an up counter and registers, and respectively generate X-addresses and Y-addresses for all of RAMs to be tested. The chip-enable-control circuit generates and outputs enable signals for the RAMs to be tested, based on the X-addresses and Y-addresses outputted from the X-address register and the Y-address register. In the self-testing circuit, the chip-enable-control circuit recognizes the shape of each RAM to be tested, based on the numbers of bits of the X-addresses and Y-addresses outputted from the X-address register and the Y-address register. Therefore, it is possible to share a data generation circuit which generates diagonal patterns, and perform tests of the circuits in parallel.

SUMMARY OF THE INVENTION

However, in the conventional BIST circuits, the bits of an address counter are fixedly allocated to respective portions of the address signal. Therefore, test patterns which can be used are limited.

For example, when the bits of the address counter illustrated in FIG. 19 are allocated to the respective portions of the address signal as illustrated in FIG. 18, the column address is most frequently changed according to the counting operation of the address counter. That is, initially, the column address is changed one by one from "0×00" to "0×3F" according to each increment operation, while the row address and the bank address are maintained "0×0000" and "0," respectively. Thereafter, the column address is cyclically changed one by one, and the row address is incremented by one every time the column address reaches "0×3F." Thus, the row address is also changed one by one from "0×0000" to "0×3FFF." Thereafter, the row address is also cyclically changed one by one, and the bank address is incremented by one every time the row address reaches "0×3FFF." Thus, the bank address is also changed one by one from "0" to "3."

According to the above operations of the address counter, it is possible to execute a test pattern in which selection of a bit line moves in the column direction at high speed. However, it is impossible to execute a test pattern in which the row address or the bank address is changed at a higher speed than the column address. In particular, recently, many semiconductor storage devices have a structure of a memory cell array including a plurality of banks in which data are inputted into and outputted from the plurality of banks through a common, global data bus. In order to raise defect-detection rates in such semiconductor storage devices, it is important to perform a data-bus interference test between the banks or a test performed at a specification maximum rate (i.e., an AT-SPEED test) in which attention is focused on the global data bus, as well as an AT-SPEED test performed at a specification maximum rate in which attention is focused on a local data bus connected to each bank.

Nevertheless, in order to make all of the above test patterns executable, it is necessary to provide a plurality of address counters in which counter cells are differently allocated to respective portions of addresses. However, in this case, the mounting area of the BIST circuit increases.

The present invention is made in view of the above problems, and an object of the present invention is to provide a semiconductor testing circuit which performs a test of a semiconductor storage device, has a simple construction, and allows increase in the number of executable test patterns.

Another object of the present invention is to provide a semiconductor storage device which has a simple construction, and allows increase in the number of executable test patterns in a self-testing circuit.

A further object of the present invention is to provide a semiconductor testing method which can be performed with a device having a simple construction, and allows increase in the number of executable test patterns.

In order to accomplish the above object, a semiconductor testing circuit for performing a test of at least one of a write operation and a read operation of a semiconductor storage device is provided. The semiconductor testing circuit comprises: a plurality of counters which designate a plurality of portions of an address signal used in the at least one of the write operation and the read operation, by count values outputted from the plurality of counters, respectively, where each of the plurality of portions is comprised of one bit or a plurality of successive bits; and a switching circuit which selectively outputs counter-control signals for individually controlling operations of the plurality of counters, where each of the counter-control signals is one of a common counter-control signal commonly used for the plurality of counters and the most significant bit of one of the plurality of portions outputted from a first one of the plurality of counters other than a second one of the plurality of counters for which the counter-control signal is outputted.

In addition, in order to accomplish the above object, a semiconductor storage device containing memory cells and a self-testing circuit which performs a test of at least one of a write operation and a read operation in the memory cells is provided. The self-testing circuit in the semiconductor storage device comprises: a plurality of counters which designate a plurality of portions of an address signal used in the at least one of the write operation and the read operation, by count values outputted from the plurality of counters, respectively, where each of the plurality of portions is comprised of one bit or a plurality of successive bits, and a switching circuit which selectively outputs counter-control signals for individually controlling operations of the plurality of counters, where each of the counter-control signals is one of a common counter-control signal commonly used for the plurality of counters and the most significant bit of one of the plurality of portions outputted from a first one of the plurality of counters other than a second one of the plurality of counters for which the counter-control signal is outputted.

Further, in order to accomplish the above object, a semiconductor testing method for performing a test of at least one of a write operation and a read operation of a semiconductor storage device is provided. The semiconductor testing method comprises the steps of: (a) selectively inputting counter-control signals into a plurality of counters so as to individually control counting operations of the plurality of counters, where each of the counter-control signals is one of the most significant bit of an output of a first one of the plurality of counters other than a second one of the plurality of counters to which the counter-control signal is inputted and a common counter-control signal which is commonly used for the plurality of counters; and (b) designating one bit or a plurality of successive bits constituting an address signal used in the at least one of the write operation and the read operation, by each of count values outputted from the plurality of counters.

The above and other objects, features and advantages of the present invention will become apparent from the following description when taken in conjunction with the accompanying drawings which illustrate preferred embodiment of the present invention by way of example.

DESCRIPTION OF THE PREFERRED EMBODIMENTS

Embodiments of the present invention are explained below with reference to drawings.

Figure 1:
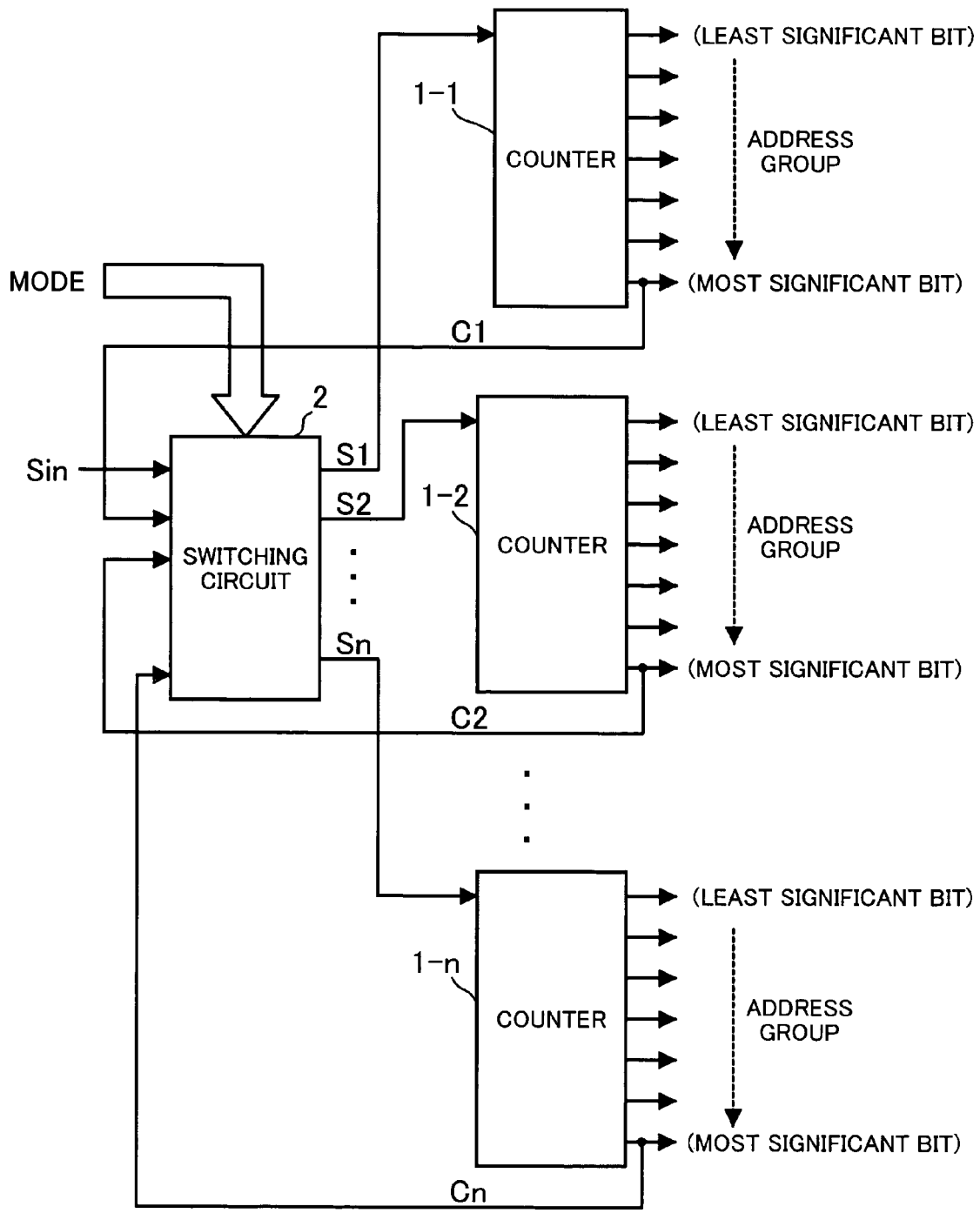
FIG. 1 is a diagram illustrating the principle of a semiconductor testing circuit according to the present invention.

FIG. 1 is a diagram illustrating the principle of a semiconductor testing circuit according to the present invention. The semiconductor testing circuit is provided for performing a preshipment test of a semiconductor storage device such as a DRAM, and is arranged as a self-testing circuit in a chip or package in which the semiconductor storage device to be tested is formed. The semiconductor testing circuit comprises a plurality of counters 1-1 to 1-n and a switching circuit 2, where n is an integer equal to or greater than one.

Each of the counters 1-1 to 1-n designates one bit or successive bits constituting a write or read address for the semiconductor storage device to be tested. That is, the count value of each of the counters 1-1 to 1-n is assigned to one bit or successive bits of a group of address signals which are to be outputted for designating a write or read address, and outputted to the semiconductor storage device. The counting operations of the counters 1-1 to 1-n are respectively controlled by counter-control signals S1 to Sn which are outputted from the switching circuit 2. For example, the counter-control signals Si to Sn provide timings of increment or decrement to the counters 1-1 to 1-n, respectively. In addition, signals C1 to Cn representing the values of the most significant bits of the count values outputted from the counters 1-1 to 1-n are supplied to the switching circuit 2, as well as to the semiconductor storage device.

The switching circuit 2 individually switches and outputs signals inputted thereto. A common counter-control signal Sin, which is commonly used by the counters 1-1 to 1-n, is inputted into the switching circuit 2. The switching circuit 2 selects and outputs as each of the counter-control signals S1 to Sn one of the common counter-control signal Sin and the signals C1 to Cn so that each of the signals C1 to Cn outputted from one of the counters 1-1 to 1-n is not supplied to the one of the counters 1-1 to 1-n. For example, one of the common counter-control signal Sin and the signals C2 to Cn is selected as the counter-control signal S1 to be supplied to the counter 1-1. The switching circuit 2 performs the above switching operation according to a mode-designation signal MODE which is externally supplied to the switching circuit 2.

According to the above construction, the assignment of the respective counters 1-1 to 1-n to the bits of the write or read address can be changed by the switching operation in the switching circuit 2. For example, in the case where n=2, when the switching circuit 2 selects the common counter-control signal Sin as the counter-control signal S1 to be supplied to the counter 1-1, and the signal C1 (representing the most significant bit of the output of the counter 1-1) as the counter-control signal S2 to be supplied to the counter 1-2, the counters 1-1 and 1-2 behave as an integral address counter so that the counters 1-1 and 1-2 are respectively assigned to a less significant portion and a more significant portion of the bits representing a write or read address. When the count values of the counters 1-1 and 1-2 respectively indicate a column address and a row address, it is possible to make the count value of the counter 1-1 (i.e., the column address) most frequently change in response to input of the common counter-control signal Sin.

On the other hand, when the switching circuit 2 selects as the counter-control signals S1 and S2 the signal C2 (representing the most significant bit of the output of the counter 1-2) and the common counter-control signal Sin, respectively, the counters 1-1 and 1-2 are respectively assigned to a more significant portion and a less significant portion of the bits representing a write or read address. Therefore, it is possible to make the count value of the counter 1-2 (i.e., the row address) most frequently change in response to input of the common counter-control signal Sin.

Further, in the case where three or more counters are used, for example, when the switching circuit 2 selects the common counter-control signal Sin for one of the three or more counters, and different ones of the signals C1 to Cn for the other ones of the three or more counters, the counters 1-1 to 1-n behave as an integral address counter. For example, in the case of a semiconductor storage device having a plurality of banks, the counters 1-1, 1-2, and 1-3 are arranged to indicate a column address, a row address, and a bank address, respectively, and the switching circuit 2 selects as the counter-control signals S1 to S3 the common counter-control signal Sin, the signal C1 (representing the most significant bit of the output of the counter 1-1), and the signal C2 (representing the most significant bit of the output of the counter 1-2), respectively. Thus, the column address, the row address, and the bank address correspond to a less significant portion, a middle significant portion, and a more significant portion of the bits representing a write or read address, respectively. That is, it is possible to perform a test in such a manner that the column address most frequently changes. In this case, it is possible to perform a test of writing or reading operations at a specification maximum speed in a page mode.

Similarly, when the switching circuit 2 selects as the counter-control signals S1 to S3 the signal C3 (representing the most significant bit of the output of the counter 1-3), the signal C1 (representing the most significant bit of the output of the counter 1-1), and the common counter-control signal Sin, respectively, the bank address, the column address, and the row address correspond to a less significant portion, a middle significant portion, and a more significant portion of the bits representing a write or read address, respectively. That is, it is possible to perform a test in such a manner that the bank address most frequently changes. In this case, it is possible to perform a test of writing or reading operations at a specification maximum speed in a bank-interleave mode.

As explained above, in the semiconductor testing circuit according to the present invention, it is possible to arbitrarily change assignment of the count values of the counters 1-1 to 1-n to a set of address signals indicating a write or read address by the switching operation in the switching circuit 2 for performing a test. Thus, the number of executable test patterns can be increased, and appropriate testing according to constructions of semiconductor storage devices to be tested is enabled.

In addition, according to the present invention, the total number of bits of the counters 1-1 to 1-n corresponds to the number of bits which are necessary for designation of a write or read address, and no additional bits are required. Therefore, it is unnecessary to increase the size of the counter circuitry. Further, since the switching circuit 2 performs only the operation of switching input signals, complex control or complex circuitry are not necessary in the switching circuit 2. Therefore, it is possible to easily increase the number of test patterns and enhance accuracy in detection of defective products without greatly increasing the equipment cost or the area of circuitry.

Hereinbelow, details of embodiments of the present invention are explained for the cases where the present invention is applied to self-testing circuits (BIST circuits) in SDRAMs (synchronous DRAMs). In the following explanations, it is assumed that each SDRAM has a storage capacity of 64 Mbits and four banks in a memory cell array.

Figure 2:
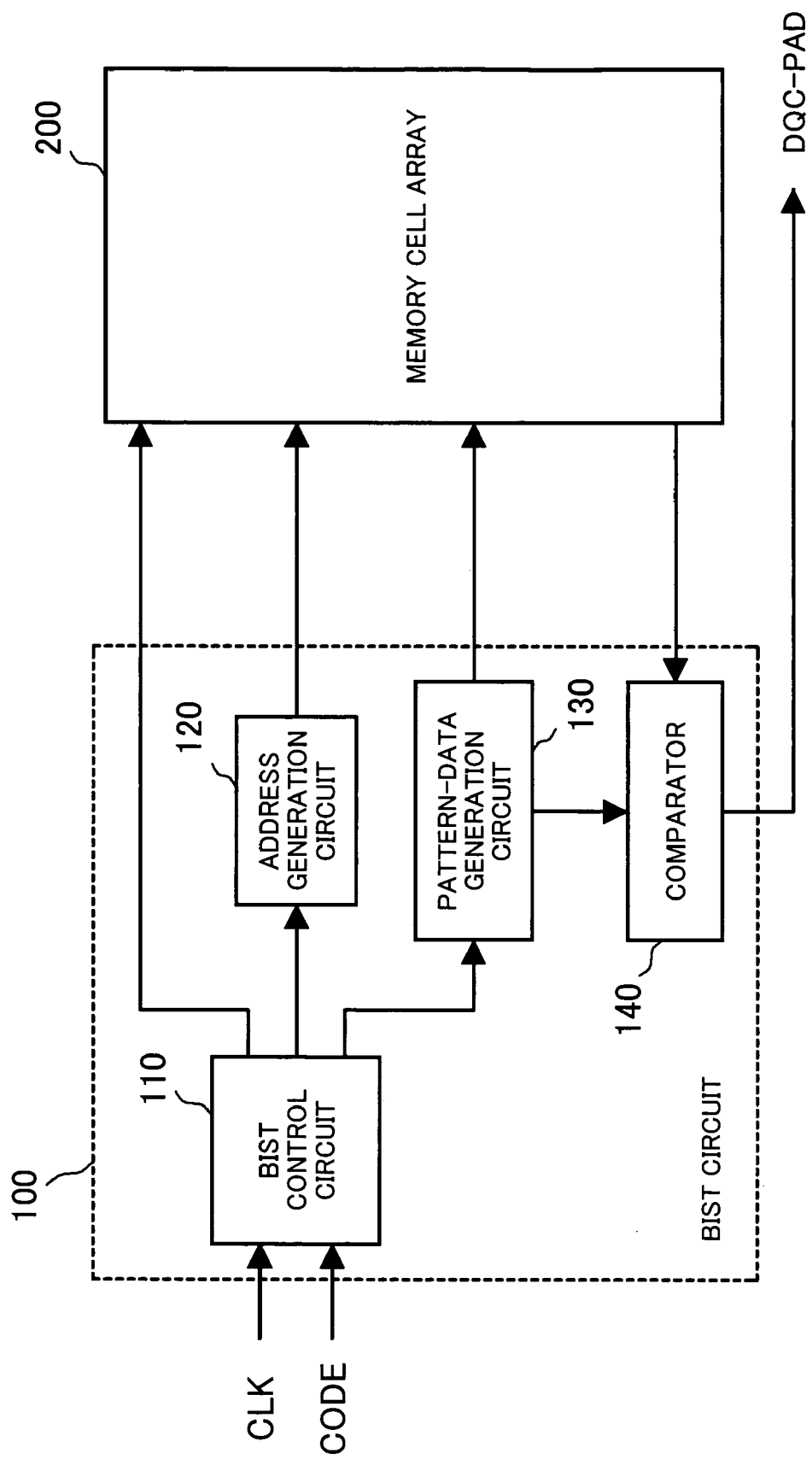
FIG. 2 is a diagram illustrating an exemplary construction of an essential portion of an SDRAM according to a first embodiment of the present invention.

FIG. 2 is a diagram illustrating an exemplary construction of an essential portion of an SDRAM according to the first embodiment of the present invention. As illustrated in FIG. 2, the SDRAM according to the first embodiment comprises a BIST circuit 100 and a memory cell array 200. The BIST circuit 100 is formed as a self-testing circuit for the memory cell array 200, in a chip or package in which the memory cell array 200 is formed. In addition, the BIST circuit 100 comprises a BIST control circuit 110, an address generation circuit 120, a pattern-data generation circuit 130, and a comparator 140.

The BIST control circuit 110 controls operations in the BIST circuit 100 and writing and reading operations in the memory cell array 200 during a test, based on a command-code signal CODE which is externally applied to the BIST control circuit 110. The BIST control circuit 110 operates in synchronization with a clock signal CLK which is also externally applied to the BIST control circuit 110.

The BIST control circuit 110 starts execution of a self-test according to the command-code signal CODE, and recognizes a test pattern designated by the command-code signal CODE. In addition, the BIST control circuit 110 outputs control signals to the memory cell array 200 according to the test pattern, where the control signals make the memory cell array 200 execute operations of writing and reading of data, activation, precharging, and the like. Further, the BIST control circuit 110 supplies the clock signal to the address generation circuit 120, and outputs a mode signal corresponding to the recognized test pattern. Furthermore, the BIST control circuit 110 supplies to the pattern-data generation circuit 130 the clock signal and a control signal designating pattern data which is to be generated in correspondence with the recognized test pattern.

The address generation circuit 120 generates addresses for writing and reading data in the memory cell array 200, according to the mode signal designated by the BIST control circuit 110, and outputs the addresses to the memory cell array 200.

The pattern-data generation circuit 130 outputs data for testing to the memory cell array 200 according to the control signal supplied from the BIST control circuit 110 to the pattern-data generation circuit 130. In addition, when data are read out from the memory cell array 200, the pattern-data generation circuit 130 outputs to the comparator 140 data representing expected values for the data read out from the memory cell array 200.

The comparator 140 compares the data read out from the memory cell array 200, with the data representing expected values and being outputted from the pattern-data generation circuit 130, determines a pass or fail, and externally outputs a result of the determination through an output terminal (DQC-PAD).

During the self-test, the memory cell array 200 performs an operation of writing the data supplied from the pattern-data generation circuit 130 based on the control signal supplied from the BIST control circuit 110, and supplies the data read out from the memory cell array 200 to the comparator 140. At this time, the memory cell array 200 decodes each address supplied from the address generation circuit 120, and selects one of bit lines, one of word lines, and one of banks so as to specify a memory cell in which the data is to be written or from which the data is read out.

As mentioned before, the memory cell array 200 has four banks, and data are inputted into and outputted from each bank through a global data bus, which is provided commonly to the four banks.

Figure 3:
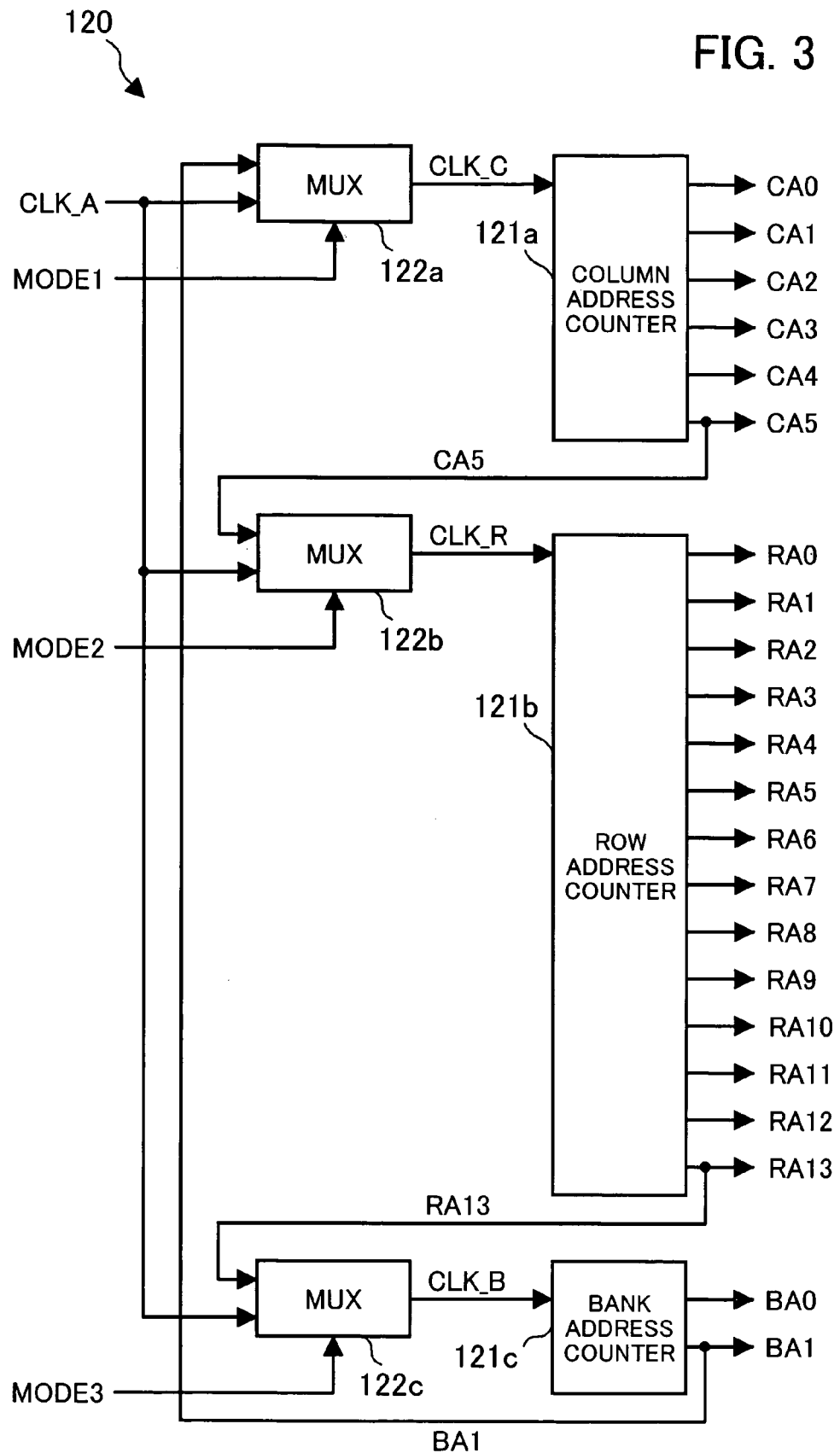
FIG. 3 is a diagram illustrating an example of an internal construction of an address generation circuit in the first embodiment of the present invention.

FIG. 3 is a diagram illustrating an example of an internal construction of the address generation circuit 120 in the first embodiment of the present invention.

As illustrated in FIG. 3, the address generation circuit 120 comprises a column address counter 121a, a row address counter 121b, a bank address counter 121c, and multiplexers (MUXs) 122a to 122c.

The column address counter 121a increments its output value in synchronization with a rising edge or a falling edge of the clock signal CLK_C outputted from the multiplexer 122a, the row address counter 121b increments its output value in synchronization with a rising edge or a falling edge of the clock signal CLK_R outputted from the multiplexer 122b, and the bank address counter 121c increments its output value in synchronization with a rising edge or a falling edge of the clock signal CLK_B outputted from the multiplexer 122c. The column address counter 121a outputs a count value having 6 bits CA0 (the least significant bit) to CA5 (the most significant bit), and designates a column address of the memory cell array 200. The row address counter 121b outputs a count value having 14 bits RA0 (the least significant bit) to RA13 (the most significant bit), and designates a row address of the memory cell array 200. The bank address counter 121c outputs a count value having 2 bits BA0 (the least significant bit) and BA1 (the most significant bit), and designates a bank address of the memory cell array 200. In addition, the most significant bit CA5 of the output of the column address counter 121a is also supplied to the multiplexer 122b, the most significant bit RA13 of the output of the row address counter 121b is also supplied to the multiplexer 122c, and the most significant bit BA1 of the output of the bank address counter 121c is also supplied to the multiplexer 122a.

Further, a common clock signal CLK_A outputted from the BIST control circuit 110 is supplied to a first input terminal of each of the multiplexers 122a to 122c. In addition, the most significant bit BA1 of the output of the bank address counter 121c is inputted to a second input terminal of the multiplexer 122a, the most significant bit CA5 of the output of the column address counter 121a is inputted to a second input terminal of the multiplexer 122b, and the most significant bit RA13 of the output of the row address counter 121b is inputted to a second input terminal of the multiplexer 122c.

The multiplexer 122a selects one of the input signals inputted to the multiplexer 122a through the first and second input terminals according to a mode signal MODE1, and outputs the selected signal as the clock signal CLK_C. The multiplexer 122b selects one of the input signals inputted to the multiplexer 122b through the first and second input terminals according to a mode signal MODE2, and outputs the selected signal as the clock signal CLK_R. The multiplexer 122c selects one of the input signals inputted to the multiplexer 122c through the first and second input terminals according to a mode signal MODE3, and outputs the selected signal as the clock signal CLK_B. Specifically, each of the multiplexers 122a to 122c selects the clock signal CLK_A when the corresponding mode signal MODE1, MODE2, or MODE3 is at the L level, and the other input signal when the corresponding mode signal MODE1, MODE2, or MODE3 is at the H level.

The BIST control circuit 110 outputs the mode signals MODE1, MODE2, and MODE3 so that only one of the mode signals MODE1, MODE2, and MODE3 is at the L level. Therefore, only one of the multiplexers 122a to 122c selects and outputs the clock signal CLK_A, which is supplied from the BIST control circuit 110. According to the above operations, when the mode signal MODE1 is at the L level, a less significant portion of the bits constituting the output of the address generation circuit 120 is assigned to the column address, a middle significant portion of the bits constituting the output of the address generation circuit 120 is assigned to the row address, and a more significant portion of the bits constituting the output of the address generation circuit 120 is assigned to the bank address. Similarly, when the mode signal MODE2 is at the L level, a less significant portion of the bits constituting the output of the address generation circuit 120 is assigned to the row address, a middle significant portion of the bits constituting the output of the address generation circuit 120 is assigned to the bank address, and a more significant portion of the bits constituting the output of the address generation circuit 120 is assigned to the column address. Further, when the mode signal MODE3 is at the L level, a less significant portion of the bits constituting the output of the address generation circuit 120 is assigned to the bank address, a middle significant portion of the bits constituting the output of the address generation circuit 120 is assigned to the column address, and a more significant portion of the bits constituting the output of the address generation circuit 120 is assigned to the row address.

Therefore, when the mode signal MODE1 is at the L level, it is possible to execute a test realizing an operation in which the column address most frequently changes. When the mode signal MODE2 is at the L level, it is possible to execute a test realizing an operation (page operation) in which the row address most frequently changes. And the mode signal MODE3 is at the L level, it is possible to execute a test realizing an operation (bank-interleave operation) in which the bank address most frequently changes.

Next, concrete examples of circuit constructions of the multiplexers 122a to 122c are explained with reference to FIGS. 4 and 5. Since the multiplexers 122a to 122c may have identical circuit constructions, the following explanations with reference to FIGS. 4 and 5 are provided for the multiplexer 122a.

Figure 4:
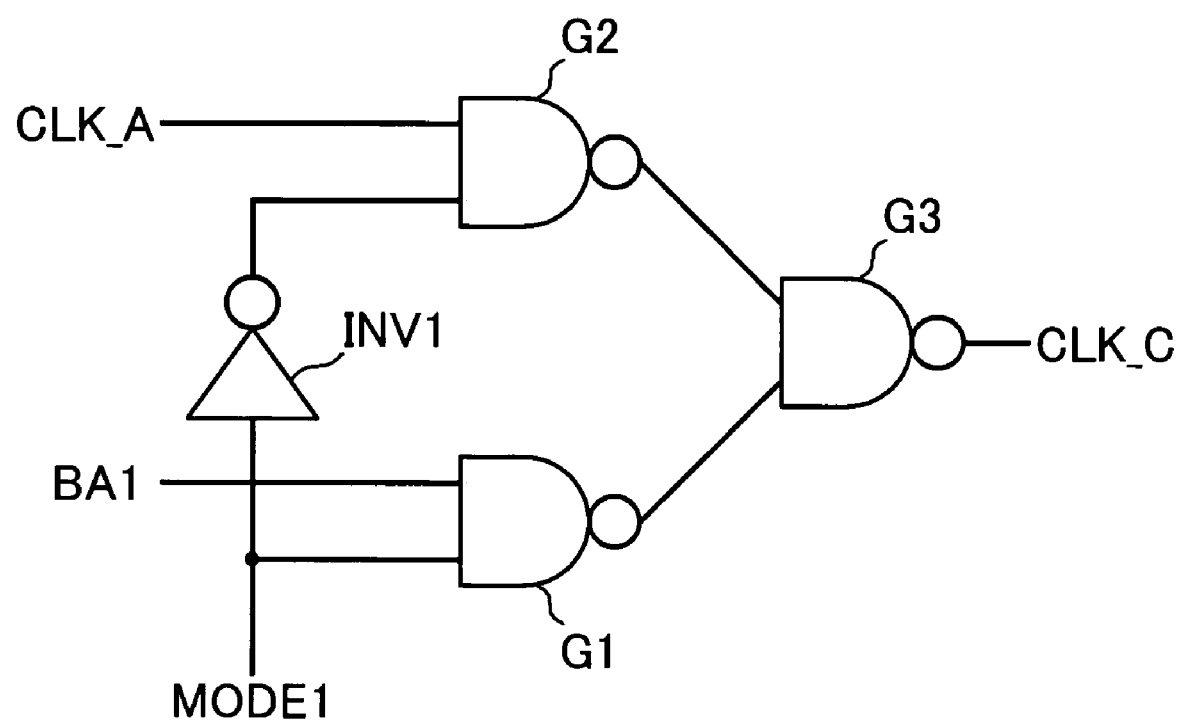
FIG. 4 is a diagram illustrating a first example of a circuit construction of a multiplexer.

FIG. 4 is a diagram illustrating a first example of a circuit construction of the multiplexer 122a. In the circuit construction of FIG. 4, the signal representing the most significant bit BA1 from the bank address counter 121c and the mode signal MODE1 from the BIST control circuit 110 are inputted into the NAND gate G1. In addition, the clock signal CLK_A from the BIST control circuit 110 is inputted into an input terminal of the NAND gate G2, and the mode signal MODE1 is inverted by an inverter INV1, and is then inputted into the other input terminal of the NAND gate G2. The output signals of the NAND gates G1 and G2 are inputted into the NAND gate G3, and the output signal of the NAND gate G3 is supplied to the column address counter 121a as the clock signal CLK_C.

In the above circuit, when the mode signal MODE1 is at the L level, the output of the NAND gate G1 is at the H level, and the NAND gate G2 outputs the inverted clock signal CLK_A. On the other hand, when the mode signal MODE1 is at the H level, the output of the NAND gate G2 is at the H level, and the NAND gate G1 outputs the inverted most significant bit BA1. That is, the NAND gate G3 outputs as the clock signal CLK_C the clock signal CLK_A when the mode signal MODE1 is at the L level, and the most significant bit BA1 when the mode signal MODE1 is at the H level.

Figure 5:
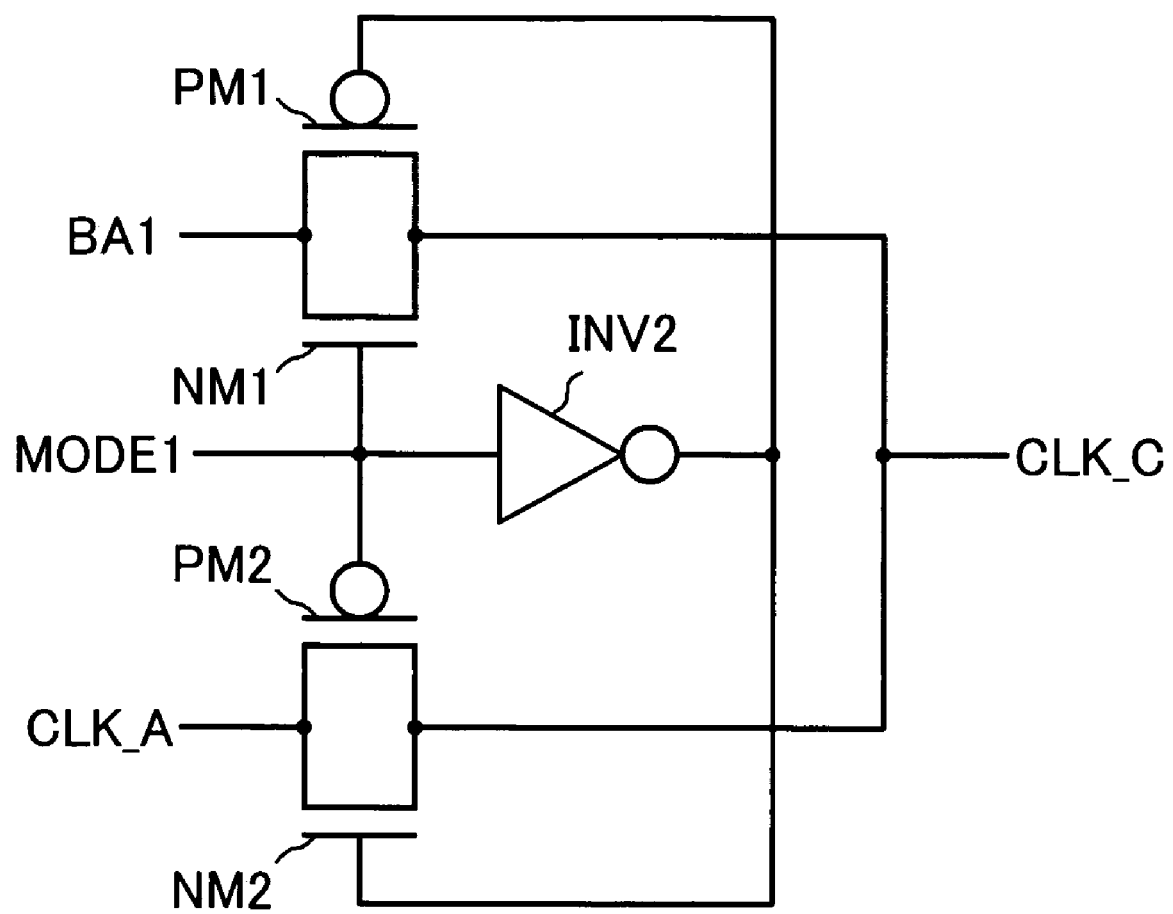
FIG. 5 is a diagram illustrating a second example of a circuit construction of the multiplexer.

FIG. 5 is a diagram illustrating a second example of a circuit construction of the multiplexer 122a. In the circuit construction of FIG. 5, the N-channel MOS (metal Oxide Semiconductor) transistor NM1 and the P-channel MOS transistor PM1 constitute a switch circuit for the most significant bit BA1, since the mode signal MODE1 is applied to the gate of the N-channel MOS transistor NM1 and the inverted mode signal MODE1 is applied from the inverter INV2 to the gate of the P-channel MOS transistor PM1. Hereinafter, P-channel MOS transistors are referred to as PMOS transistors, and N-channel MOS transistors are referred to as NMOS transistors. In addition, the NMOS transistor NM2 and the PMOS transistor PM2 constitute a switch circuit for the clock signal CLK_A, since the mode signal MODE1 is applied to the gate of the PMOS transistor PM2 and the inverted mode signal MODE1 is applied from the inverter INV2 to the gate of the NMOS transistor NM2.

Therefore, when the mode signal MODE1 is at the H level, the NMOS transistor NM1 and the PMOS transistor PM1 are in an ON state, and the most significant bit BA1 is outputted as the clock signal CLK_C. On the other hand, when the mode signal MODE1 is at the L level, the NMOS transistor NM2 and the PMOS transistor PM2 are in an ON state, and the clock signal CLK_A is outputted as the clock signal CLK_C.

Each of the multiplexers 122b and 122c can also be realized by the circuit of FIG. 4 or 5 except that the most significant bit BA1 should be replaced with the most significant bit CA5 or RA13, the mode signal MODE1 should be replaced with the mode signal MODE2 or MODE3, and the clock signal CLK_C should be replaced with the clock signal CLK_R or CLK_B.

Hereinbelow, examples of test patterns which can be executed on the SDRAM according to the first embodiment of the present invention, and operations during tests are explained. First, examples of test patterns in which an operation in a page mode is performed and the column address is most frequently changed are explained.

Figure 6:
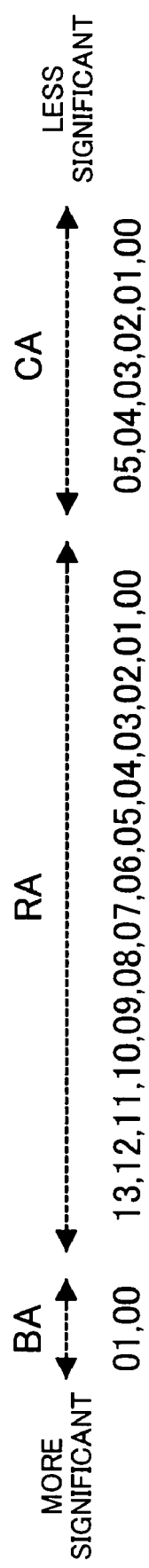
FIG. 6 is a diagram illustrating address assignment in each address counter in the case where the column address is most frequently changed.

FIG. 6 is a diagram illustrating address assignment in each address counter in the case where the column address is most frequently changed.

In case where the column address is most frequently changed, in the address generation circuit 120, the mode signal MODE1 is at the L level, and the mode signals MODE2 and MODE3 are at the H level. Thus, in the address generation circuit 120, a 22-bit address counter as illustrated in FIG. 6 is formed, where the bits of the output of the address generation circuit 120 are assigned to the column address, the row address, and the bank address in ascending order of bit significance.

Figure 7:
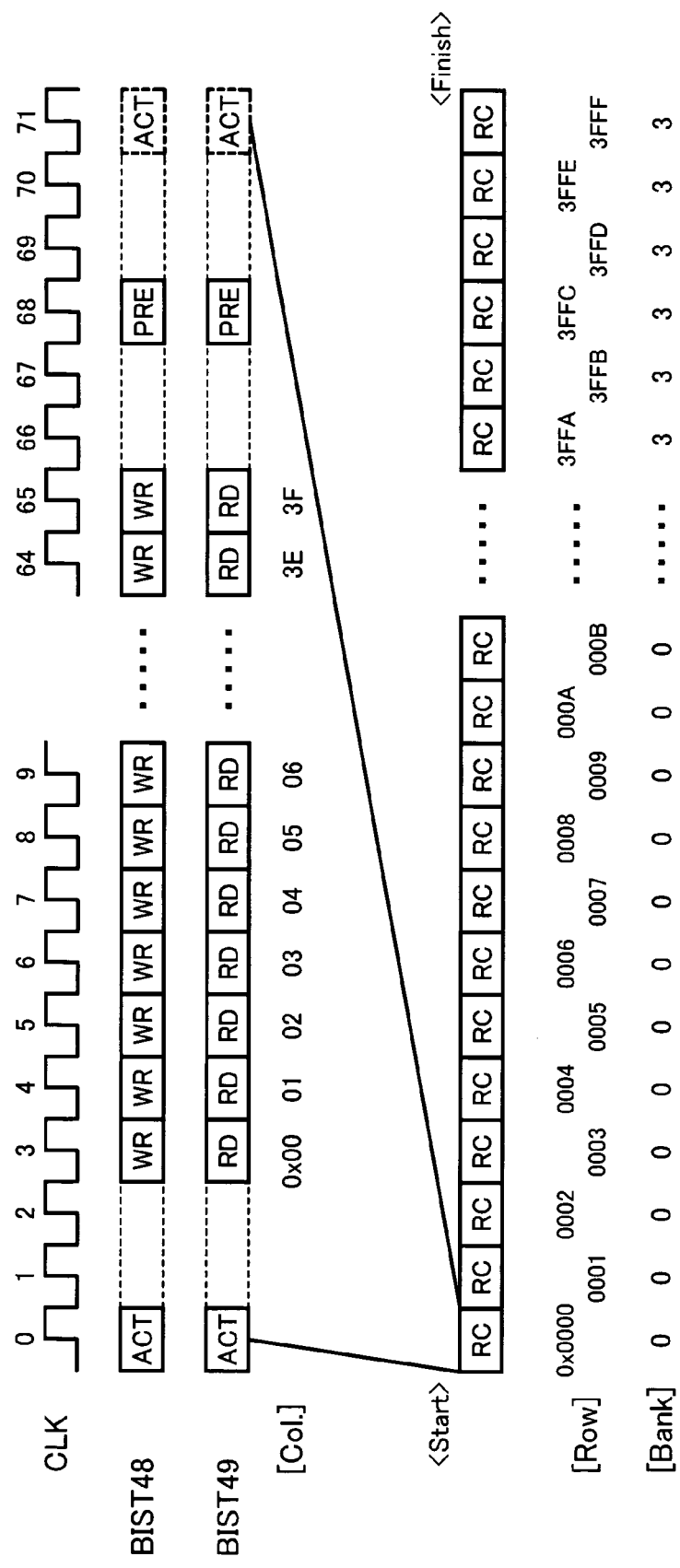
FIG. 7 is a timing diagram for explaining examples of test patterns in which the column address is most frequently changed.

FIG. 7 is a timing diagram for explaining examples of test patterns in which the column address is most frequently changed. In FIG. 7, "WD" and "RD" respectively indicate execution of writing and reading operations in the memory cell array 200, "ACT" and "PRE" respectively indicate execution of operations of activation and precharging in the memory cell array 200, and "RC" indicates a RAS cycle during which all bit lines connected to a selected word line are successively selected. In the upper portion of FIG. 7, the writing and reading operations and the like executed during a RAS cycle RC are indicated with values of the designated address (column address) which is successively changed. In the lower portion of FIG. 7, values of the designated addresses (row and bank addresses) each of which is suc- cessively changed are indicated. In addition, the clock signal CLK_A synchronizes with the clock signal CLK.

In the examples of FIG. 7, at the times of writing and reading operations, the signals "BIST48" and "BIST49" are externally designated as the command-code signal CODE. When the command-code signal CODE is designated, the BIST control circuit 110 sets the mode signal MODE1 at the L level, and the mode signals MODE2 and MODE3 at the H level.

In the examples of FIG. 7, the command-code signal "BIST48" is first designated, and data from the pattern-data generation circuit 130 are written in all memory cells in the memory cell array 200. In the address generation circuit 120, the column address is most frequently changed in synchronization with the clock signal CLK_A. That is, the column address is successively changed from "0×00" to "0×3F." That is, bit lines on a word line selected by the row address "0×0000" in the bank having the bank address "0" are successively selected in synchronization with the clock signal CLK_A, and data are written. In addition, operations of activation and precharging of the memory cell array 200 are respectively performed before and after a series of writing operations in each RAS cycle.

Thereafter, in the second RAS cycle, the row address is changed to "0×0001" in correspondence with the output of the most significant bit CA5, and then all of the bit lines are selected again. Thereafter, the word lines are successively selected by changing the row address, and further the bank address is changed. Thus, similar writing operations are performed in each of the four banks.

Next, the command-code signal "BIST49" is designated, and all of the data written in the memory cell array 200 are read out. For the reading operation, the designated address is changed in the order of the column address, the row address, and the bank address, as in the writing operation. The data read out as above are subject to comparison by the comparator 140. The result of the comparison is externally outputted, so that defects in the device can be detected.

When the test patterns as described the above are used, a data inversion test on a local data bus (word line) in each bank can be performed in write and read cycles at a specification maximum rate.

Next, test patterns in which the row address is most frequently changed are explained. In the following example, the test patterns are provided for a marching test.

Figure 8:
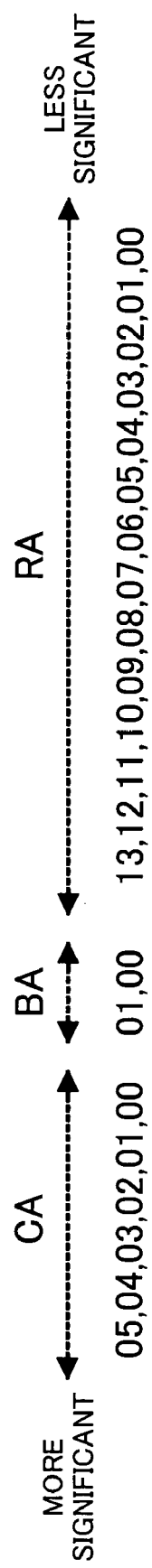
FIG. 8 is a diagram illustrating address assignment in each address counter in the case where the row address is most frequently changed.

FIG. 8 is a diagram illustrating address assignment in each address counter in the case where the row address is most frequently changed.

In the case where the row address is most frequently changed, in the address generation circuit 120, the mode signal MODE2 is at the L level, and the mode signals MODE1 and MODE3 are at the H level. Thus, in the address generation circuit 120, a 22-bit address counter as illustrated in FIG. 8 is formed, where the bits of the output of the address generation circuit 120 are assigned to the row address, the bank address, and the column address in ascending order of bit significance.

Figure 9:
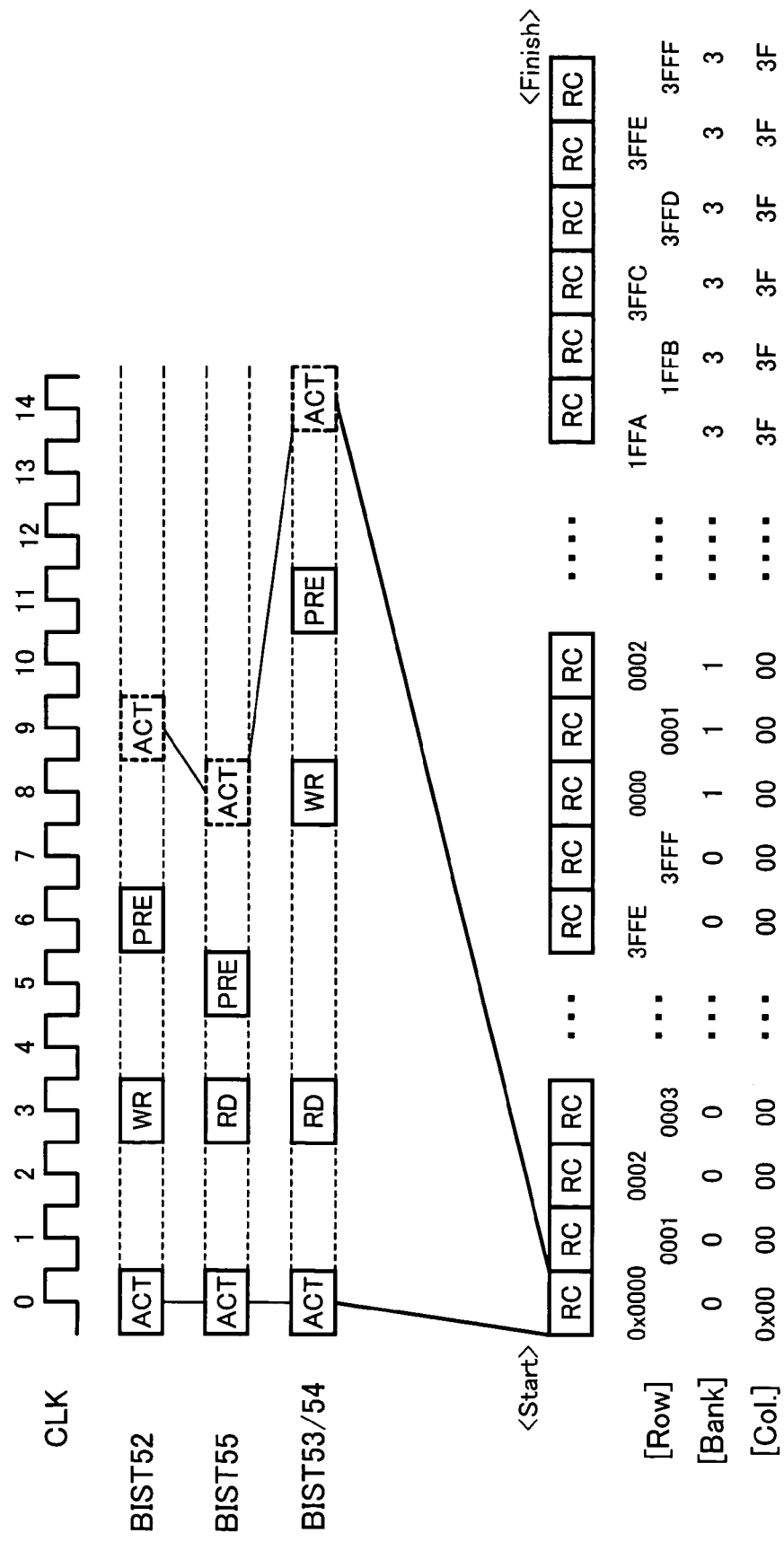
FIG. 9 is a timing diagram for explaining examples of test patterns in which the row address is most frequently changed.

FIG. 9 is a timing diagram for explaining examples of test patterns in which the row address is most frequently changed.

In FIG. 9, a data writing operation is performed in a RAS cycle in response to the command-code signal "BIST52," and a data reading operation is performed in the RAS cycle corresponding to the command-code signal "BIST55."

On the other hand, in the RAS cycle corresponding to the command-code signal "BIST53" or "BIST54," an operation of reading data is performed, and thereafter the inverse of the read data is written. When the above command-code signals CODE are designated, the BIST control circuit 110 sets the mode signals MODE1, MODE2, and MODE3 at the H, L, and H levels, respectively.

In the examples of FIG. 9, the command-code signal "BIST52" is first designated, and data are written in all memory cells in the memory cell array 200. In each RAS cycle corresponding to the command-code signal "BIST52," an operation of writing data in a single memory cell is performed. In addition, in the address generation circuit 120, the row address is most frequently changed in correspondence with the clock signal CLK_A. All word lines are successively selected in respective RAS cycles, and writing operations are performed in all memory cells connected to the respective word lines and along a selected bit line in a selected bank. Every time writing operations on all of the word lines along a selected bit line in a selected bank are completed, the selected bank is successively changed, and similar writing operations are performed in all memory cells connected to the selected bit line in respective banks. Every time writing operations in all memory cells connected to the selected bit line in all of the banks are completed, the selected bit line is successively changed, and similar writing operations are performed in all memory cells connected to each bit line.

After the above operations in response to the command-code signal "BIST52" are completed, the command-code signals "BIST53," "BIST54," and "BIST55" are successively designated, and operations for each test pattern are performed, where all of the memory cells are designated by changing the designated address in such a manner that the row address, the bank address, and the column address are changed in this order. When the above test patterns are used, it is possible to perform a data inversion test in which the row address is most frequently changed.

Further, in the case where a writing or reading operation is performed in each RAS cycle such as the RAS cycle corresponding to the command-code signal "BIST52" or "BIST55," it is also possible to perform an internal checker test or the like. In the internal checker test, the number of clock cycles which occur after the operation of activation is performed until the writing or reading operation is started and the number of clock signals which occur after the writing or reading operation is performed until the operation of precharging is started are changed.

Next, test patterns in which the bank address is most frequently changed are explained.

Figure 10:
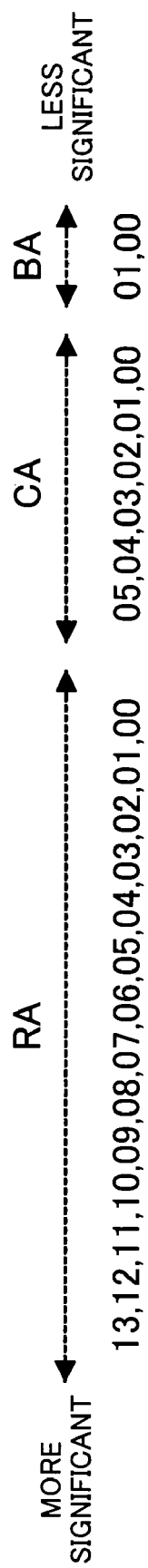
FIG. 10 is a diagram illustrating address assignment in each address counter in the case where the bank address is most frequently changed.

FIG. 10 is a diagram illustrating address assignment in each address counter in the case where the bank address is most frequently changed.

In the case where the bank address is most frequently changed, in the address generation circuit 120, the mode signal MODE3 is at the L level, and the mode signals MODE1 and MODE2 are at the H level. Thus, in the address generation circuit 120, a 22-bit address counter as illustrated in FIG. 10 is formed, where the bits of the output of the address generation circuit 120 are assigned to the bank address, the column address, and the row address in ascending order of bit significance.

Figure 11:
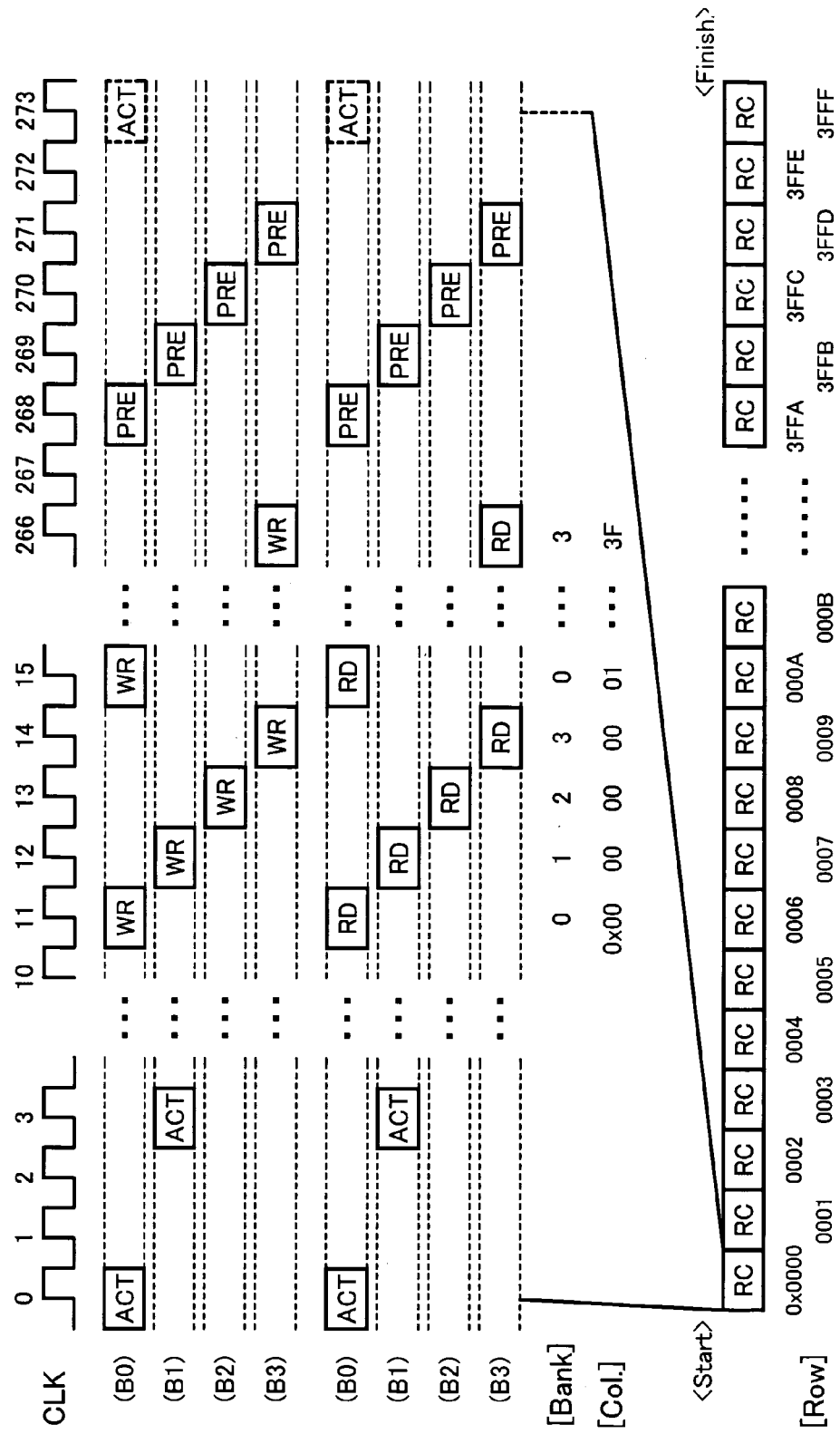
FIG. 11 is a timing diagram for explaining examples of test patterns in which the bank address is most frequently changed.

FIG. 11 is a timing diagram for explaining examples of test patterns in which the bank address is most frequently changed.

In the examples of FIG. 11, a series of operations at each row address is performed in a RAS cycle. In the first RAS cycle in response to the command-code signal "BIST50," a bank-interleave operation in which the bank address is successively changed is performed so that data are written in the respective banks while the column address and the row address are fixed. Every time a bank-interleave operation in memory cells corresponding to a column address and a row address is completed, the column address is successively changed, and data are written in memory cells corresponding to each column address and the row address in all of the banks. Thus, a series of operations of writing data in memory cells corresponding to all of the column addresses and the above row address in all of the banks are performed in a RAS cycle. Every time a series of operations of writing data in memory cells corresponding to all of the column addresses and a row address in all of the banks is completed, the row address is successively changed, and operations similar to those performed in the first RAS cycle are performed at each row address. Thus, data are written in all of the memory cells.

After the above operations in response to the command-code signal "BIST50," the above data are read out by similar bank-interleave operations in response to the command-code signal "BIST51," so that defects in the device can be detected.

According to the above test patterns, a data inversion test, a data-bus interference test, and the like on a global data bus which is common to all of the banks can be performed in write and read cycles at a specification maximum rate.

As explained above, although only the counters corresponding to a minimum necessary number of bits are provided in the BIST circuit 100, it is possible to easily change assignment of the column address, the row address, and the bank address, and execute various types of test patterns in which different portions of address signals are most frequently changed. Therefore, accuracy in detection of defective products can be enhanced while minimizing increase in the equipment cost and the mounting area. In particular, according to the first embodiment, it is possible to perform both of an AT-SPEED test in which attention is focused on the global data bus and another AT-SPEED test in which attention is focused on a local data bus corresponding to each bank. That is, it is possible to perform tests appropriate for the structures of the recent semiconductor memory devices.

Next, concrete examples of circuit constructions of each address counter. Each address counter can be realized by an asynchronous counter or a synchronous counter. The following explanations are provided for the column address counter 121a as an example.

Figure 12:
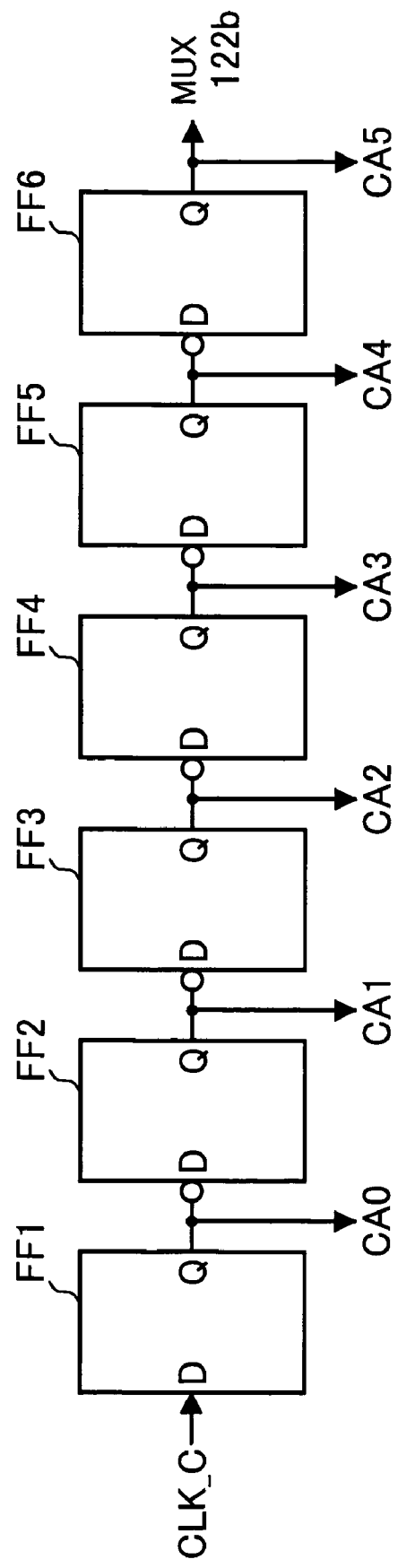
FIG. 12 is a diagram illustrating an outline of a construction of a column address counter realized by an asynchronous counter.

FIG. 12 is a diagram illustrating an outline of a construction of the column address counter 121a realized by an asynchronous counter.

In the case where an asynchronous counter is used, as illustrated in FIG. 12, the column address counter 121a can be constituted by flip-flop circuits FF1 to FF6 which are connected in series and the number of which corresponds to the number of output bits of the column address counter 121a. Specifically, the clock signal CLK_C is inputted into the flip-flop circuit FF1 in the first stage, and the output of the flip-flop circuit FF1 becomes the least significant bit (LSB) CA0 of the count value, and is inverted and inputted into the flip-flop circuit FF2 in the next stage. Similarly, the other bits CA1 to CA5 of the count value are outputted from the flip-flop circuits FF2 to FF6, respectively. The output signal from the flip-flop circuit FF6 in the last stage is also supplied to the multiplexer 122b.

Figure 13:
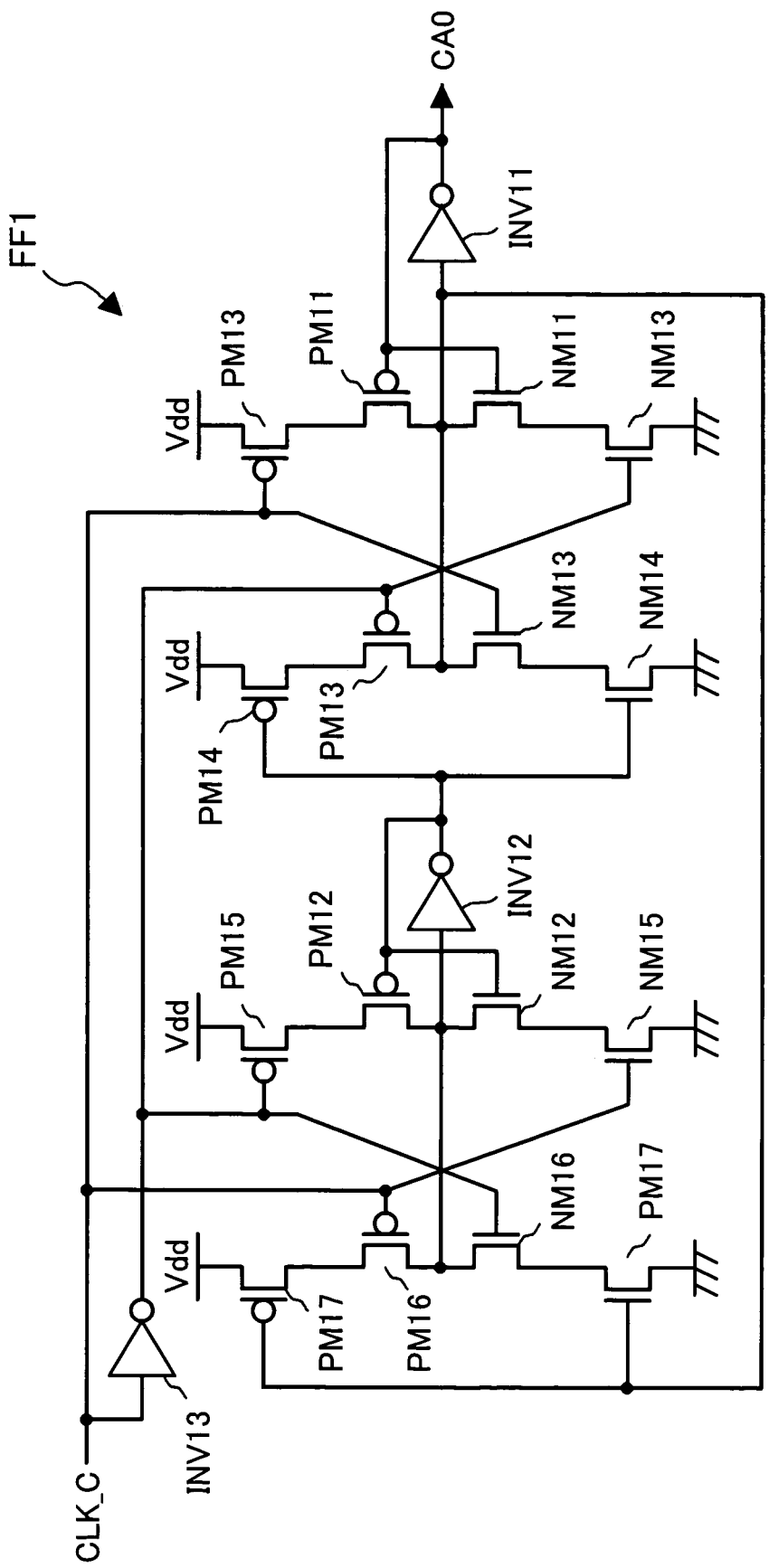
FIG. 13 is a diagram illustrating an example of a circuit construction of a flip-flop circuit constituting the asynchronous counter of FIG. 12.

FIG. 13 is a diagram illustrating an example of a circuit construction of each of the flip-flop circuits constituting the asynchronous counter of FIG. 12. Although the following explanations are provided for the flip-flop circuit FF1 as an example, the other flip-flop circuits FF2 to FF6 also have similar circuit construction.

In the output stage of the flip-flop circuit FF1 illustrated in FIG. 13, a latch circuit is formed with an inverter INV11 and a CMOS (Complementary-MOS) inverter circuit which is constituted by a PMOS transistor PM11 and an NMOS transistor NM11. Similar to above, in the middle portion of the flip-flop circuit FF1, another latch circuit is formed with an inverter INV12 and a CMOS inverter circuit which is constituted by a PMOS transistor PM12 and an NMOS transistor NM12. The clock signal CLK_C is inputted into the flip-flop circuit FF1, and inverted by the inverter INV13.

In the latch circuit in the output stage, when the clock signal CLK_C inputted into the flip-flop circuit FF1 is at the L level, the PMOS transistor PM13 is brought into an ON state, and the NMOS transistor NM13, which receives the inverted clock signal CLK_C, is also brought into an ON state, so a latch operation is performed. When the clock signal CLK_C is at the H level, both of the PMOS transistor PM13 and the NMOS transistor NM13 in the immediately preceding stage are brought into an ON state, and therefore the output signal of the CMOS inverter circuit constituted by the PMOS transistor PM14 and the NMOS transistor NM14 is inputted into the inverter INV11. The output of the inverter INV11 becomes the bit CA0 of the count value.

On the other hand, in the latch circuit in the middle stage, when the clock signal CLK_C is at the H level, both of the PMOS transistor PM15 and the NMOS transistor NM15 are brought into an ON state, and therefore a latch operation is performed. When the clock signal CLK_C is at the L level, both of the PMOS transistor PM16 and the NMOS transistor NM16 in the immediately preceding stage are brought into an ON state, and therefore the output signal of the CMOS inverter circuit constituted by the PMOS transistor PM17 and the NMOS transistor NM17 is inputted into the inverter INV12. The input into the inverter INV11 is fed back as the input into the CMOS inverter circuit constituted by the PMOS transistor PM17 and the NMOS transistor NM17. The output of the inverter INV12 becomes the input into the CMOS inverter circuit constituted by the PMOS transistor PM14 and the NMOS transistor NM14.

The flip-flop circuit FF1 having the above construction operates as follows.

When the clock signal CLK_C is at the H level, the latch circuit in the middle stage operates. At this time, if the output of the inverter INV12 is at the H level, the inverse of the output of the inverter INV12 is inputted into the inverter INV11, so that the bit CA0 of the count value is brought to the H level.

Next, when clock signal CLK_C changes to the L level, the latch circuit in the output stage operates, so that the bit CA0 of the count value to be outputted is maintained at the H level. In addition, the inverse of the bit CA0 of the count value is fed back to the CMOS inverter circuit constituted by the PMOS transistor PM17 and the NMOS transistor NM17, and the input into the inverter INV12 is brought to the H level.

Thereafter, when the clock signal CLK_C changes to the H level again, the circuit in the middle stage operates, so that the output of the inverter INV12 is maintained at the L level. The output of the inverter INV12 is inputted into the inverter INV11 through the CMOS inverter circuit constituted by the PMOS transistor PM14 and the NMOS transistor NM14, so that the bit CA0 of the count value to be outputted is brought to the L level.

Next, when clock signal CLK_C changes to the L level again, the latch circuit in the output stage operates, so that the bit CA0 of the count value to be outputted is maintained at the L level. Thereafter, the bit CA0 of the count value alternates between the H level and the L level in synchronization with rise timings of the clock signal CLK_C.

The above construction of the column address counter 121a is merely an example. The column address counter 121a may have another circuit construction using another asynchronous counter.

Figure 14:
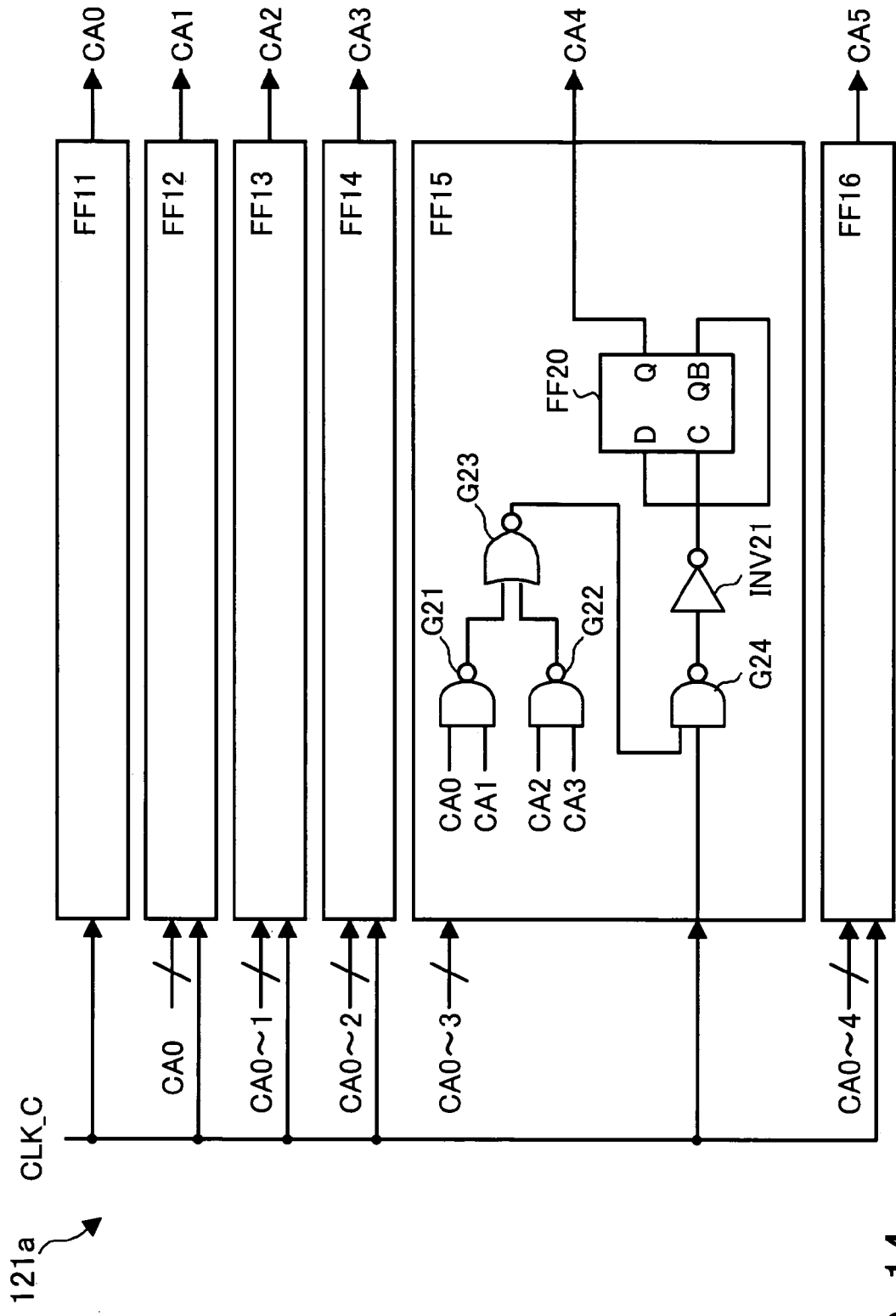
FIG. 14 is a diagram illustrating an outline of a construction of a column address counter realized by a synchronous counter.

FIG. 14 is a diagram illustrating an outline of a construction of the column address counter 121a realized by a synchronous counter.

In the case where a synchronous counter is used, as illustrated in FIG. 14, the column address counter 121a can be constituted by flip-flop circuits FF11 to FF16 the number of which corresponds to the number of output bits of the column address counter 121a. The clock signal CLK_C is inputted into each of the flip-flop circuits FF11 to FF16, and each of the flip-flop circuits FF12 to FF16 receives one or more outputs of all of one or more flip-flop circuits located on the less-significant side of each of the flip-flop circuits FF12 to FF16. The output CA0 of the flip-flop circuit FF11 is inverted in synchronization with a falling edge of the clock signal CLK_C, and the output CA1, CA2, CA3, CA4, or CA5 of each of the flip-flop circuits FF12 to FF16 is inverted in synchronization with a falling edge of the clock signal CLK_C when all of the one or more outputs of the one or more flip-flop circuits located on the less-significant side of each of the flip-flop circuits FF12 to FF16 are at the H level.

In addition, FIG. 14 also shows an example of a circuit construction of the flip-flop circuit FF15. In this example, the NAND gates G21 and G22 receive the less significant bits CA0 to CA3 of the count value, and the outputs of the NAND gates G21 and G22 are inputted into the NAND gate G23. Thus, the output of the NAND gate G23 is brought to the H level when all of the less significant bits CA0 to CA3 of the count value change to the H level.

Further, the output of the NAND gate G23 and the clock signal CLK_C are inputted to the NAND gate G24, and the output of the NAND gate G24 is applied to the clock input terminal C of the flip-flop circuit FF20 through the inverter INV21. Therefore, the clock input of the flip-flop circuit FF20 is brought to the H level when all of the less significant bits CA0 to CA3 of the count value and the clock signal CLK_C are at the H level. The Q output of the flip-flop circuit FF20 becomes the bit CA4 of the count value, and the inverse of the Q output (i.e., the QB output) is fed back to the data input terminal D of the flip-flop circuit FF20.

Furthermore, the essential portion of each of the other flip-flop circuits FF11 to FF14 and FF16 is identical to the essential portion of the flip-flop circuit FF15. That is, the flip-flop circuit FF11 comprises the flip-flop circuit FF20, and each of the other flip-flop circuits FF12 to FF14 and FF16 has various gate circuits so that one of the inputs of the NAND gate G24 other than the clock signal CLK_C is at the H level when one or more outputs of all of one or more flip-flop circuits located on the less-significant side of each of the flip-flop circuits FF12 to FF14 and FF16 are at the H level.

Figure 15:
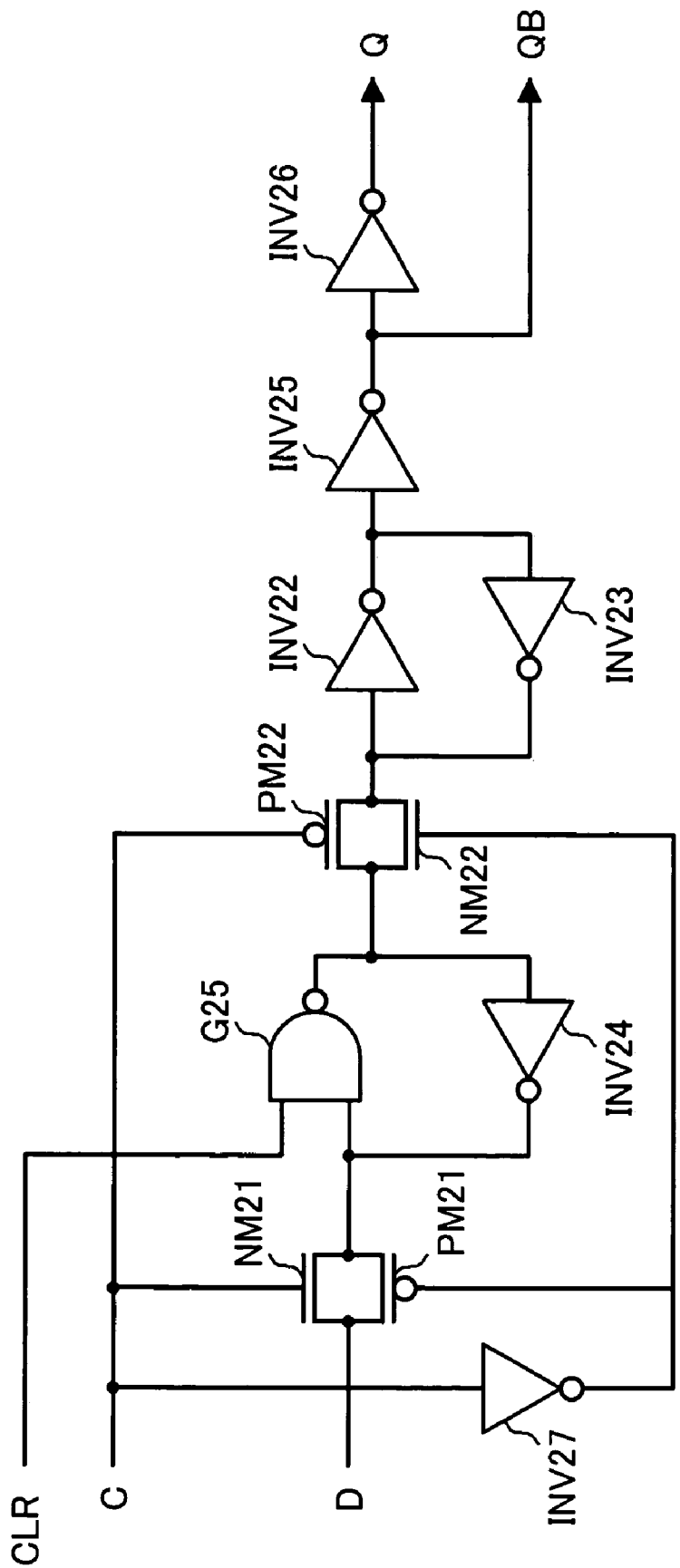
FIG. 15 is a diagram illustrating an example of a circuit construction of a flip-flop circuit constituting the synchronous counter of FIG. 14.

FIG. 15 is a diagram illustrating an example of a circuit construction of the flip-flop circuit FF20.

The flip-flop circuit FF20 illustrated in FIG. 15 comprises a latch circuit in each of input and output stages. The latch circuit in the input stage is constituted by a NAND gate G25 and an inverter INV24, and the latch circuit in the output stage is constituted by inverters INV22 and INV23. The output of the inverter INV22 is obtained from the output terminal Q through inverters INV25 and INV26.

On the other hand, the output of the inverter INV25 is fed back to the data input terminal D through the inverted output terminal QB. The data input terminal D is connected to one of input terminals of the NAND gate G25 through a switch circuit constituted by an NMOS transistor NM21 and a PMOS transistor PM21. A clear signal CLR is inputted into the other input terminal of the NAND gate G25. The output of the NAND gate G25 is inputted into the inverter INV22 through a switch circuit constituted by an NMOS transistor NM22 and a PMOS transistor PM22.

When the input into the clock input terminal C of the flip-flop circuit FF20 is at the L level, the PMOS transistor PM22 is brought into an ON state, and the NMOS transistor NM22 is also brought into an ON state by the input signal inputted into the clock input terminal C which is inverted by the inverter INV27. Therefore, the output of the NAND gate G25 updates the output of the latch circuit in the output stage. At this time, for example, the output signal from the output terminal Q may be at the H level.

Next, when the input into the clock input terminal C of the flip-flop circuit FF20 is changed to the H level, both of the PMOS transistor PM22 and the NMOS transistor NM22 are brought into an OFF state, and the output from the output terminal Q is maintained at the H level by an operation of the latch circuit in the output stage. In addition, both of the PMOS transistor PM21 and the NMOS transistor NM21 are brought into an ON state, and the output of the NAND gate G25 is updated to the H level since the NAND gate G25 receives the inverted output QB of the flip-flop circuit FF20.

Thereafter, when the input into the clock input terminal C of the flip-flop circuit FF20 is changed to the L level again, the output of the NAND gate G25 brings the output from the output terminal Q to the L level. Further, when the input into the clock input terminal C of the flip-flop circuit FF20 is changed to the H level again, the output from the output terminal Q is maintained at the L level, and the output of the NAND gate G25 is updated to the L level. Thereafter, the output from the output terminal Q alternates between the H level and the L level in synchronization with fall timings of the input into the clock input terminal C.

Generally, synchronous counters can realize higher counting rates than asynchronous counters. However, the synchronous counters need greater mounting areas than the asynchronous counters. Therefore, it is desirable to select a synchronous counter or an asynchronous counter for each address counter according to the circumstances. For example, in a relatively greater number of cases, operations in page or bank-interleave modes require address changes at high rates. Therefore, for example, it is possible to realize each of the column address counter 121a and the bank address counter 121c by a synchronous counter and the row address counter 121b by an asynchronous counter. In this case, the address change rates can be increased while minimizing increase in the mounting area.

Alternatively, it is possible to provide both of a synchronous counter and an asynchronous counter for forming each address counter, and selectively use one of the synchronous counter and the asynchronous counter on an as needed basis during test operations by using a switching circuit. An example of such a construction is explained below in the second embodiment of the present invention.

Figure 16:
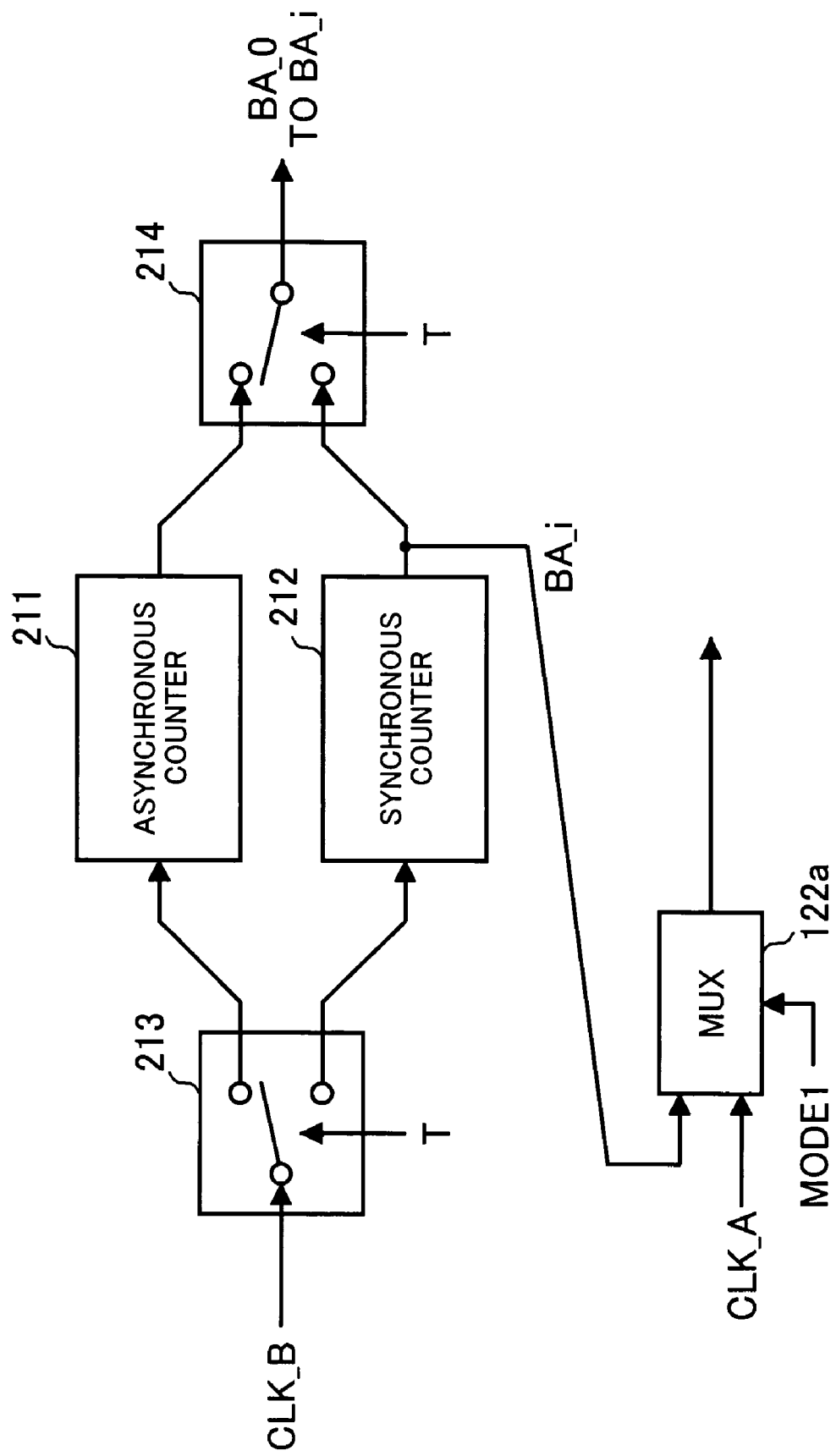
FIG. 16 is a diagram illustrating an exemplary construction of an essential portion of a DRAM according to a second embodiment of the present invention.

FIG. 16 is a diagram illustrating an exemplary construction of an essential portion of a DRAM according to the second embodiment of the present invention.

The basic construction of a BIST circuit arranged in the DRAM according to the second embodiment is similar to the first embodiment. That is, a column address counter, a row address counter, a bank address counter, and multiplexers are provided in an address generation circuit, where the multiplexers switch the outputted clock signals CLK_C, CLK_R, and CLK_B so as to make the address counters execute operations for counting an address. However, the second embodiment is characterized in that both of a synchronous counter and an asynchronous counter are provided for forming the bank address counter, and one of the synchronous counter and the asynchronous counter can be selected by using a switching circuit.

As illustrated in FIG. 16, the bank address counter according to the second embodiment comprises an asynchronous counter 211, a synchronous counter 212, and selectors 213 and 214. The asynchronous counter 211 and the synchronous counter 212 have identical numbers of output bits, and the selectors 213 and 214 are provided for switching the input and output of the bank address counter between the asynchronous counter 211 and the synchronous counter 212. Specifically, the selector 213 selects the asynchronous counter 211 or the synchronous counter 212 as the destination of the clock signal CLK_B, and the selector 214 selects and outputs the output of the asynchronous counter 211 or the synchronous counter 212 as a count value comprised of bits BA_0 to BA_i, where i is an integer equal to or greater than one. In addition, the most significant bit BA_i is also supplied to the multiplexer 122a as in the first embodiment.

The selection in the selectors 213 and 214 is switched based on a timing signal T, which is outputted from the BIST circuit. The timing signal T is at the H level during operations of writing or reading data in the memory cell array. When the timing signal T is at the H level, the selector 213 connects its output to the synchronous counter 212, and the selector 214 connects its input to the synchronous counter 212. On the other hand, when the timing signal T is at the L level, the selector 213 connects its output to the asynchronous counter 211, and the selector 214 connects its input to the asynchronous counter 211. That is, the synchronous counter 212 is used during operations of writing or reading data in the memory cell array, and the asynchronous counter 211 is used during the other operations such as the operations for activation or precharging.

Figure 17:
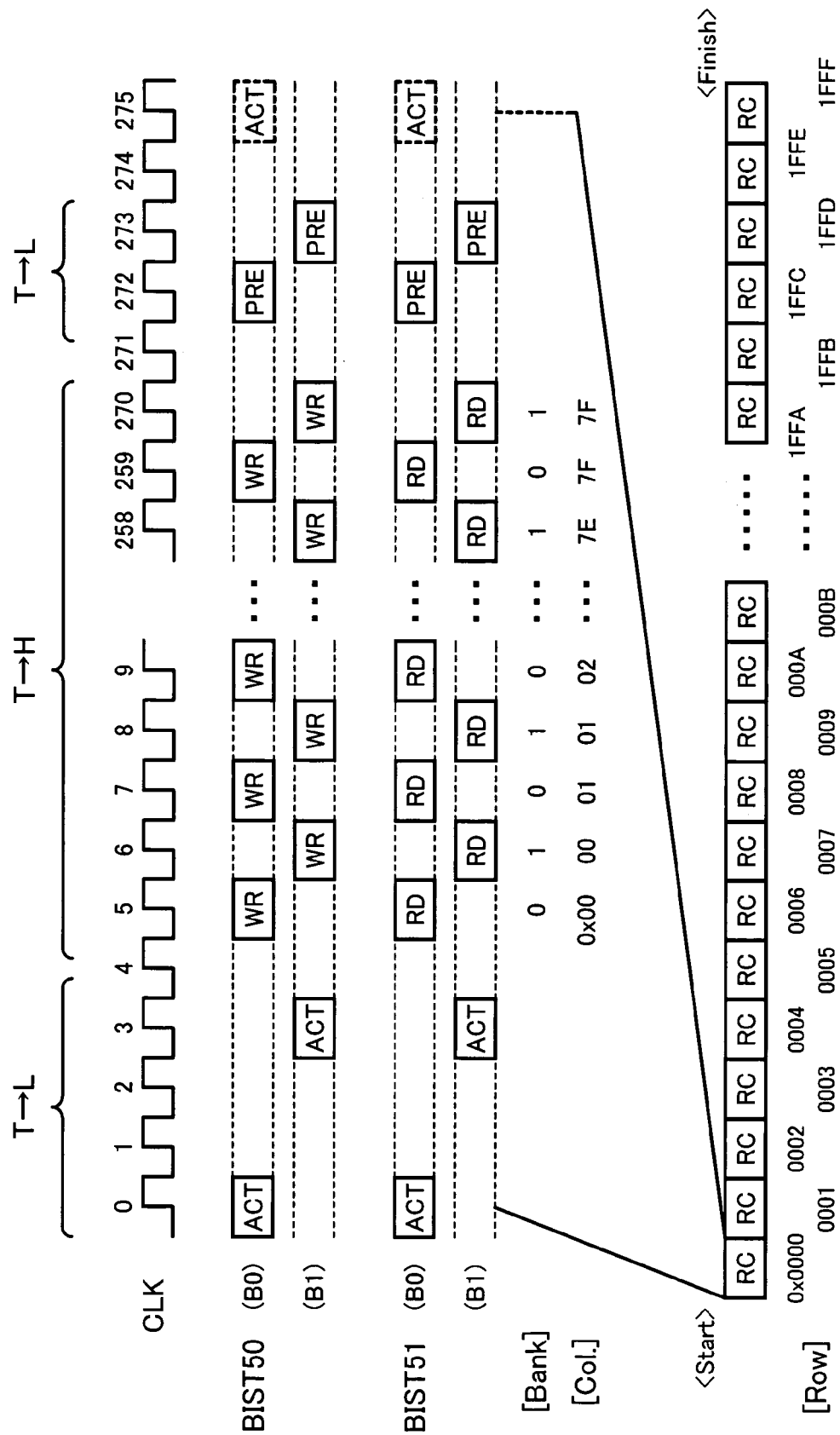
FIG. 17 is a timing diagram for explaining examples of test patterns in the second embodiment in which the bank address is most frequently changed.
Figure 18:
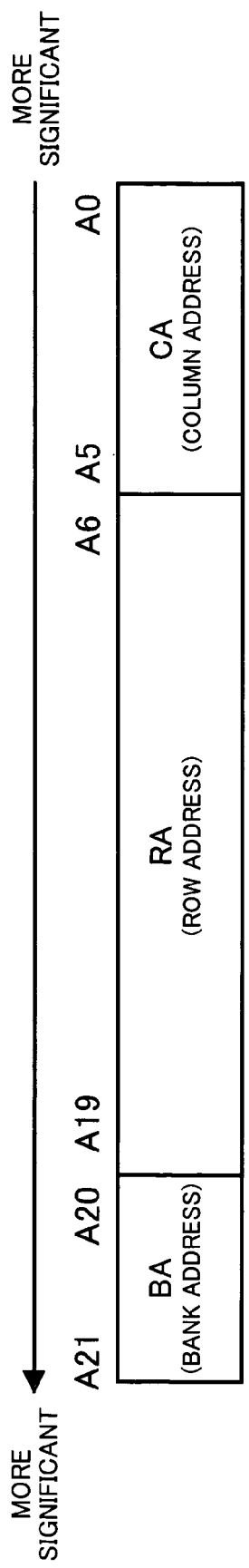
FIG. 18 is a diagram illustrating an example of assignment of logical addresses for a memory cell array.
Figure 19:
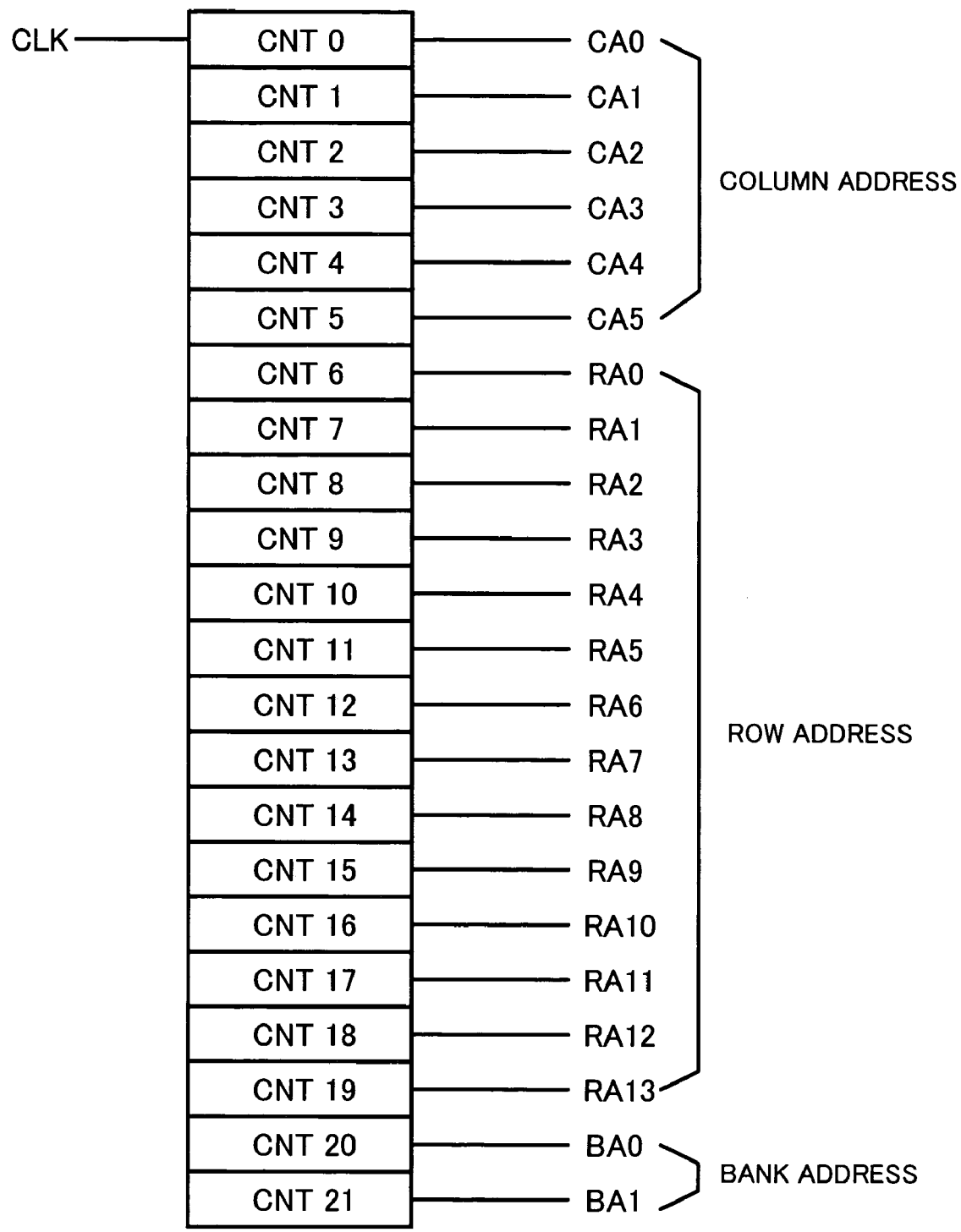
FIG. 19 is a diagram illustrating an exemplary construction of a conventional address counter provided in a BIST circuit.

FIG. 17 is a timing diagram for explaining examples of test patterns in the second embodiment in which the bank address is most frequently changed.

FIG. 17 shows examples of test patterns in which bank-interleave operations are performed in a DRAM which has two banks. In the examples illustrated in FIG. 17, although switching between the banks during data writing or reading operations is required to be performed relatively quickly, it is unnecessary to change designation of a bank so quickly during the operations of activation or precharging. Therefore, it is preferable to set the timing signal at the H level so as to use the synchronous counter 212 during only the writing and reading operations. In addition, since the most significant bit of the count value outputted from the synchronous counter 212 controls the counting operation of the column address counter 121a, the column address is changed during only the writing and reading operations.

Therefore, according to the second embodiment, it is possible to easily increase the bank switching rate during only the writing and reading operations, and easily perform a test at a high rate which is required, while minimizing increase in the mounting area. For example, the above construction can be applied to a case where the number of banks in the memory device is greater than the number in the second embodiment, and only a portion of the banks is tested. In this case, writing and reading operations in the test can be performed by providing a synchronous counter which outputs a count value corresponding to the number of banks which are to be tested.

As explained above, in the semiconductor testing circuit according to the present invention, it is possible to easily change assignment of write or read addresses for a semiconductor storage device to count values of respective counters by switching output signals by use of a switching circuit, without increasing the size of the entire address counter which designates the write or read addresses. Therefore, the number of executable test patterns increases, and accuracy of the test is enhanced.

In addition, in the self-testing circuit provided in the semiconductor storage device according to the present invention, it is possible to easily change assignment of write or read addresses for a semiconductor storage device to count values of respective counters by switching output signals by use of a switching circuit, without increasing the size of the entire address counter which designates the write or read addresses. Therefore, the number of test patterns which can be executed in the self-testing circuit increases, and accuracy of the test is enhanced.

Further, in the semiconductor testing method according to the present invention, it is possible to easily change assignment of write or read addresses for a semiconductor storage device to count values of respective counters by switching control signals to be supplied to the respective counters, by use of a switching circuit, without increasing the size of the entire address counter which designates the write or read addresses. Therefore, the number of executable test patterns increases, and accuracy of the test is enhanced.

The foregoing is considered as illustrative only of the principle of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor testing circuit for performing a test of a semiconductor storage device, comprising:
   a plurality of counters which designate a plurality of different portions of an address signal used in at least one of a write operation and a read operation of the semiconductor storage device, said at least one of a write operation and a read operation comprising the test of the semiconductor storage device, each of the plurality of different portions comprising one bit or a plurality of successive bits; and
   a switching circuit which selectively outputs counter-control signals for individually controlling operations of said plurality of counters, where each of said counter-control signals is one of a common counter-control signal commonly used for said plurality of counters and the most significant bit of one of said plurality of portions outputted from a first one of said plurality of counters other than a second one of said plurality of counters for which said each of said counter-control signals is outputted.

2. The semiconductor testing circuit according to claim 1, wherein said switching circuit outputs said common counter-control signal to one of said plurality of counters, and said most significant bit to each of another or others of said plurality of counters.

3. The semiconductor testing circuit according to claim 1, wherein said switching circuit comprises a plurality of individual switching circuits which are respectively provided in correspondence with said plurality of counters, and said counter-control signals are outputted from the plurality of individual switching circuits corresponding to said plurality of counters, respectively.

4. The semiconductor testing circuit according to claim 1, wherein a first one of said plurality of counters designates a column address of said semiconductor storage device, and a second one of said plurality of counters designates a row address of said semiconductor storage device.

5. The semiconductor testing circuit according to claim 4, wherein said first one of said plurality of counters is realized by a synchronous counter, and said second one of said plurality of counters is realized by an asynchronous counter.

6. The semiconductor testing circuit according to claim 4, wherein a third one of said plurality of counters designates a bank address of said semiconductor storage device.

7. The semiconductor testing circuit according to claim 1, wherein one of said plurality of counters comprises,
   an asynchronous counter,
   a synchronous counter having an output the most significant bit of which is inputted into said switching circuit, and
   a counter selection circuit which receives one of said counter-control signals outputted for said one of said plurality of counters, selectively outputs the received one of the counter-control signals to one of said asynchronous counter and said synchronous counter, selectively receives a count value outputted from said one of the asynchronous counter and the synchronous counter, and outputs the received count value as one of said plurality of portions designated by said one of said plurality of counters.

8. The semiconductor testing circuit according to claim 7, wherein said counter selection circuit selects said synchronous counter as a destination to which the counter selection circuit outputs the received one of the counter-control signals and a source from which the counter selection circuit receives said count value, when said at least one of the write operation and the read operation is performed.

9. The semiconductor testing circuit according to claim 7, wherein said one of the plurality of portions designated by said one of said plurality of counters designates a bank address of said semiconductor storage device.

10. A semiconductor chip comprising:
    a semiconductor storage device; and
    a self-testing circuit for performing a test of a semiconductor storage device;
    said self-testing circuit includes,
    a plurality of counters which designate a plurality of different portions of an address signal used in at least one of a write operation and a read operation of the semiconductor storage device, each of the plurality of different portions comprising one bit or a plurality of successive bits, and
    a switching circuit which selectively outputs counter-control signals for individually controlling operations of said plurality of counters, where each of said counter-control signals is one of a common counter-control signal commonly used for said plurality of counters and the most significant bit of one of said plurality of portions outputted from a first one of said plurality of counters other than a second one of said plurality of counters for which said each of said counter-control signals is outputted.

11. A packaged semiconductor device comprising:
a semiconductor storage device;
a self-testing circuit which performs a test of a semiconductor storage device; and
a package in which said semiconductor storage device and said self-testing circuit are packed;
said self-testing circuit includes,
a plurality of counters which designate a plurality of different portions of an address signal used in at least one of a write operation and a read operation of the semiconductor storage device, each of the plurality of portions comprising one bit or a plurality of successive bits, and
a switching circuit which selectively outputs counter-control signals for individually controlling operations of said plurality of counters, where each of said counter-control signals is one of a common counter-control signal commonly used for said plurality of counters and the most significant bit of one of said plurality of portions outputted from a first one of said plurality of counters other than a second one of said plurality of counters for which said each of said counter-control signals is outputted.

12. A semiconductor storage device comprising:
memory cells; and
a self-testing circuit which performs a test of said memory cells;
said self-testing circuit includes,
a plurality of counters which designate a plurality of portions of an address signal used in at least one of a write operation and a read operation of the semiconductor storage device, by count values outputted from the plurality of counters, respectively, where each of the plurality of portions is comprised of one bit or a plurality of successive bits, and
a switching circuit which selectively outputs counter-control signals for individually controlling operations of said plurality of counters, where each of said counter-control signals is one of a common counter-control signal commonly used for said plurality of counters and the most significant bit of one of said plurality of portions outputted from a first one of said plurality of counters other than a second one of said plurality of counters for which said each of said counter-control signals is outputted.

13. The semiconductor storage device according to claim 12, wherein said switching circuit outputs said common counter-control signal to one of said plurality of counters, and said most significant bit to each of another or others of said plurality of counters.

14. The semiconductor storage device according to claim 12, wherein said memory cells are arranged in a plurality of banks, which can be designated by said address signal, and the plurality of banks share a data bus through which data are written in or read from said memory cells.

15. A semiconductor testing method for performing a test of a semiconductor storage device, comprising the steps of:
(a) selectively inputting counter-control signals into a plurality of counters so as to individually control counting operations of the plurality of counters, where each of the counter-control signals is one of the most significant bit of an output of a first one of the plurality of counters other than a second one of the plurality of counters to which said each of the counter-control signals is inputted and a common counter-control signal which is commonly used for said plurality of counters; and
(b) designating one bit or a plurality of successive bits constituting an address signal used in at least one of a write operation and a read operation of the semiconductor storage device, said at least one of a write operation and a read operation comprising the test of the semiconductor storage device, by each of count values outputted from the plurality of counters.

16. The semiconductor testing method according to claim 15, wherein said common counter-control signal is inputted into one of said plurality of counters, and said most significant bit is inputted into each of another or others of said plurality of counters.

17. The semiconductor testing method according to claim 15, wherein a column address is designated by a count value outputted from one of the plurality of counters to which said common counter-control signal is inputted, so as to perform said at least one of the write operation and the read operation in a page mode.

18. The semiconductor testing method according to claim 15, wherein a bank address is designated by a count value outputted from one of the plurality of counters to which said common counter-control signal is inputted, so as to perform said at least one of the write operation and the read operation in a bank-interleave mode.

* * * * *